United States Patent
Ma et al.

(10) Patent No.: US 11,139,819 B2
(45) Date of Patent: Oct. 5, 2021

(54) PARAMETER DETERMINATION METHOD AND DEVICE FOR SPREAD SPECTRUM CIRCUIT, AND CLOCK SPREAD SPECTRUM METHOD AND DEVICE

(71) Applicant: BOE TECHNOLOGY GROUP CO., LTD., Beijing (CN)

(72) Inventors: Yuhai Ma, Beijing (CN); Xiangye Wei, Beijing (CN); Liming Xiu, Beijing (CN); Yiming Bai, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 15 days.

(21) Appl. No.: 16/651,511

(22) PCT Filed: Apr. 23, 2019

(86) PCT No.: PCT/CN2019/083899
§ 371 (c)(1),
(2) Date: Mar. 27, 2020

(87) PCT Pub. No.: WO2020/215206
PCT Pub. Date: Oct. 29, 2020

(65) Prior Publication Data
US 2021/0242874 A1    Aug. 5, 2021

(51) Int. Cl.
*H03L 7/18* (2006.01)
*H03L 7/085* (2006.01)

(52) U.S. Cl.
CPC .............. *H03L 7/18* (2013.01); *H03L 7/085* (2013.01)

(58) Field of Classification Search
CPC combination set(s) only.
See application file for complete search history.

(56) References Cited

U.S. PATENT DOCUMENTS 4,791,387 A * 12/1988 Hasegawa ................ H03L 7/23
331/16
10,686,458 B1 * 6/2020 Xiu ......................... H03L 7/099
(Continued)

FOREIGN PATENT DOCUMENTS

| EP | 0655829 | 5/1995 |
|----|---------|--------|
| EP | 1073194 | 1/2001 |
| EP | 1494349 | 1/2005 |

OTHER PUBLICATIONS

Fabio Pareschi, et al. "EMI Reduction via Spread Spectrum in DC/DC Converters: State of the Art, Optimization, and Tradeoffs" IEEE Access, vol. 3, 2015, pp. 2857-2874.

*Primary Examiner* — Adam D Houston
(74) *Attorney, Agent, or Firm* — Leason Ellis LLP

(57) ABSTRACT

A parameter determination method for a spread spectrum circuit, a clock spread spectrum method, a parameter determination device for a spread spectrum circuit, and a clock spread spectrum device are disclosed. The parameter determination method for the spread spectrum circuit includes: obtaining a base time unit and a target frequency; determining a spread spectrum depth coefficient according to the base time unit and the target frequency; determining whether the spread spectrum depth coefficient is greater than or equal to a base spread spectrum depth coefficient; if yes, determining the spread spectrum depth coefficient as a standard spread spectrum depth coefficient and determining a standard frequency control word according to the standard spread spectrum depth coefficient; and if no, adjusting the base time unit until a corresponding spread spectrum depth coefficient corresponding to the base time unit is greater than or equal to the base spread spectrum depth coefficient.

20 Claims, 8 Drawing Sheets

(56) References Cited

U.S. PATENT DOCUMENTS

| | | | |
|---|---|---|---|
| 10,973,440 B1* | 4/2021 | Martin | G06T 19/20 |
| 2004/0136440 A1* | 7/2004 | Miyata | H03L 7/08 |
| | | | 375/130 |
| 2005/0008113 A1* | 1/2005 | Kokubo | G06F 1/04 |
| | | | 375/376 |
| 2008/0080655 A1* | 4/2008 | Gilliland | H04B 15/02 |
| | | | 375/376 |
| 2008/0107154 A1* | 5/2008 | Hsiao-Chyi | H03L 7/1974 |
| | | | 375/130 |
| 2010/0090775 A1* | 4/2010 | Huda | H03K 3/84 |
| | | | 332/117 |
| 2010/0177364 A1* | 7/2010 | Yoshigae | H04N 1/047 |
| | | | 358/483 |
| 2011/0285439 A1* | 11/2011 | Xiu | G06F 1/025 |
| | | | 327/159 |
| 2013/0328604 A1* | 12/2013 | Matsuda | H03L 7/107 |
| | | | 327/159 |
| 2016/0049947 A1* | 2/2016 | Adachi | H03L 7/1976 |
| | | | 327/159 |
| 2016/0217237 A1* | 7/2016 | Kurosu | G06F 30/3312 |
| 2017/0353108 A1* | 12/2017 | Joos | H02M 3/158 |
| 2018/0062661 A1* | 3/2018 | Kumar | H03L 7/099 |
| 2019/0238143 A1* | 8/2019 | Xiu | G06F 1/08 |
| 2021/0075426 A1* | 3/2021 | Wei | H03L 7/085 |
| 2021/0075431 A1* | 3/2021 | Wei | H03L 7/0991 |
| 2021/0099661 A1* | 4/2021 | Shimatani | H04N 5/378 |
| 2021/0159893 A1* | 5/2021 | Wei | G06F 1/04 |

* cited by examiner

PARAMETER DETERMINATION METHOD AND DEVICE FOR SPREAD SPECTRUM CIRCUIT, AND CLOCK SPREAD SPECTRUM METHOD AND DEVICE

CROSS-REFERENCE TO RELATED PATENT APPLICATIONS

This application is a U.S. National Stage Application under 35 U.S.C. § 371 of International Patent Application No. PCT/CN2019/083899, filed Apr. 23, 2019, which is incorporated by reference in its entirety.

TECHNICAL FIELD

Embodiments of the present disclosure relate to a parameter determination method for a spread spectrum circuit, a clock spread spectrum method, a parameter determination device for a spread spectrum circuit, and a clock spread spectrum device.

BACKGROUND

Electromagnetic interference (EMI) refers to the influence of the circuit system on the surrounding circuit system through conduction or radiation. Electromagnetic interference may degrade the circuit performance, and further may even cause the failure of the entire circuit system. A clock signal is usually a signal with the highest frequency and steepest edge in a circuit system, and most electromagnetic interference problems are related to high frequency clock signals. Methods for reducing electromagnetic interference include shielding, filtering, isolation, signal edge control, layout of a printed circuit board (PCB) (such as providing a power layer and a ground (GND) layer in the PCB), etc. However, these methods have the high cost and low efficiency, and also have a certain negative impact on the performance of the circuit system.

Spread spectrum clock generation (SSCG) refers to the effect of reducing the electromagnetic interference of the electronic system by dynamically adjusting the output frequency of the clock signal within a certain range to disperse the spectrum energy of the clock signal.

SUMMARY

At least some embodiments of the present disclosure provide a parameter determination method for a spread spectrum circuit, and the parameter determination method for the spread spectrum circuit includes: obtaining a base time unit and a target frequency; determining a spread spectrum depth coefficient according to the base time unit and the target frequency; determining whether the spread spectrum depth coefficient is greater than or equal to a base spread spectrum depth coefficient; adjusting the base time unit until a corresponding spread spectrum depth coefficient is greater than or equal to the base spread spectrum depth coefficient in a case where the spread spectrum depth coefficient is smaller than the base spread spectrum depth coefficient; and determining the spread spectrum depth coefficient as a standard spread spectrum depth coefficient and determining a standard frequency control word according to the standard spread spectrum depth coefficient in a case where the spread spectrum depth coefficient is greater than or equal to the base spread spectrum depth coefficient.

For example, in the parameter determination method for the spread spectrum circuit provided by some embodiments of the present disclosure, determining the spread spectrum depth coefficient includes: determining a frequency control word according to the base time unit and the target frequency, and determining the spread spectrum depth coefficient according to the frequency control word.

For example, in the parameter determination method for the spread spectrum circuit provided by some embodiments of the present disclosure, determining the spread spectrum depth coefficient according to the frequency control word includes: determining a spread spectrum manner, and determining the spread spectrum depth coefficient according to the spread spectrum manner and the frequency control word.

For example, in the parameter determination method for the spread spectrum circuit provided by some embodiments of the present disclosure, the spread spectrum manner includes a boundary spread spectrum, a central spread spectrum, an up spread spectrum, or a down spread spectrum; in a case where the spread spectrum manner is the boundary spread spectrum, the spread spectrum depth coefficient is expressed as:

$$\delta_{max} = \frac{1}{I_{ad} + 0.5};$$

in a case where the spread spectrum manner is the central spread spectrum, the spread spectrum depth coefficient is expressed as:

$$\delta_{max} < \frac{2*(1 - r_{ad})}{I_{ad} + r_{ad}},$$

or $$\delta_{max} \leq \frac{2*r_{ad}}{I_{ad} + r_{ad}};$$

in a case where the spread spectrum manner is the up spread spectrum, the spread spectrum depth coefficient is expressed as:

$$\delta_{max} \leq \frac{r_{ad}}{I_{ad} + r_{ad}};$$

and in a case where the spread spectrum manner is the down spread spectrum, the spread spectrum depth coefficient is expressed as:

$$\delta_{max} < \frac{1 - r_{ad}}{I_{ad} + r_{ad}},$$

where $\delta_{max}$ represents the spread spectrum depth coefficient, $I_{ad}$ is an integer part of the frequency control word, and $r_{ad}$ is a decimal part of the frequency control word.

For example, in the parameter determination method for the spread spectrum circuit provided by some embodiments of the present disclosure, determining the standard frequency control word according to the standard spread spectrum depth coefficient includes: determining an integer part and a decimal part of the standard frequency control word according to the standard spread spectrum depth coefficient, where the standard frequency control word is expressed as: $F_r=I_r+r_r$, $F_r$ represents the standard frequency control word, $I_r$ represents the integer part of the standard frequency control word $F_r$, and $r_r$ represents the decimal part of the standard frequency control word $F_r$.

For example, in the parameter determination method for the spread spectrum circuit provided by some embodiments of the present disclosure, in a case where the spread spectrum depth coefficient is greater than or equal to the base spread spectrum depth coefficient, and the spread spectrum depth coefficient is determined as the standard spread spectrum depth coefficient, in a case where the spread spectrum manner is the boundary spread spectrum, the integer part of the standard frequency control word is $I_r=I_{ad}$, and the decimal part of the standard frequency control word is $r_r=0.5$; and in a case where the spread spectrum manner is the central spread spectrum, the up spread spectrum, or the down spread spectrum, the integer part of the standard frequency control word is $I_r=I_{ad}$, and the decimal part of the standard frequency control word is $r_r=r_{ad}$.

For example, in the parameter determination method for the spread spectrum circuit provided by some embodiments of the present disclosure, in a case where the spread spectrum depth coefficient is greater than or equal to the base spread spectrum depth coefficient, the base time unit is determined as a standard base time unit; the standard frequency control word corresponds to a reference frequency, and the reference frequency is expressed as:

$$f_s^r = f_T * \frac{F_T}{F_r},$$

where $f_s^r$ is the reference frequency, $f_T$ is the target frequency, and $F_T$ is the frequency control word; and the standard frequency control word is expressed as: $F_r=I_r+r_r=1/(f_s^r*\Delta_1)$, and $\Delta_1$ represents the standard base time unit.

At least some embodiments of the present disclosure further provide a clock spread spectrum method based on the parameter determination method for the spread spectrum circuit according to any one of the above embodiments, and the clock spread spectrum method includes: obtaining a reference frequency control word, where the reference frequency control word is the standard frequency control word obtained according to the parameter determination method for the spread spectrum circuit according to any one of the above embodiments; determining a target frequency control word according to the reference frequency control word and a modulation parameter, where the target frequency control word varies discretely with time; and generating a spread spectrum output signal after spreading spectrum according to the target frequency control word, where the spread spectrum output signal corresponds to the target frequency control word.

For example, in the clock spread spectrum method provided by some embodiments of the present disclosure, the modulation parameter includes a modulation mode and a reference spread spectrum depth coefficient, and the reference spread spectrum depth coefficient is the standard spread spectrum depth coefficient obtained according to the parameter determination method for the spread spectrum circuit according to any one of the above embodiments; and the target frequency control word is expressed as:

$$F(t) = F_{re} * \left[1 + \frac{\delta_{re}}{2} * M(t)\right],$$

where F(t) represents the target frequency control word, $F_{re}$ represents the reference frequency control word, $\delta_{re}$ represents the reference spread spectrum depth coefficient, M(t) represents a modulation function determined according to the modulation mode, and t represents time.

For example, in the clock spread spectrum method provided by some embodiments of the present disclosure, the modulation function is an original modulation function, and the modulation function is expressed as: $M(t)=\xi(t)$, where $\xi(t)$ represents the original modulation function; or, the modulation function is a compensation modulation function after compensating for the original modulation function, and the modulation function is expressed as:

$$M(t) = E(\xi(t)) = \frac{\xi(t)}{1 - \frac{\delta_{re}}{2} * \xi(t)},$$

or $$M(t) = E(\xi(t)) = \frac{-\xi(t)}{1 + \frac{\delta_{re}}{2} * \xi(t)},$$

where Et ($\xi(t)$) represents the compensation modulation function, and $\xi(t)$ represents the original modulation function.

For example, in the clock spread spectrum method provided by some embodiments of the present disclosure, the modulation parameter includes a modulation mode, and generating the spread spectrum output signal after spreading spectrum according to the target frequency control word includes: determining a reference base time unit; determining a modulation function according to the modulation mode; and determining the spread spectrum output signal based on the modulation function, the reference base time unit, and the target frequency control word, where a spread spectrum frequency of the spread spectrum output signal is expressed as:

$$f(M(t)) = \frac{1}{F(t)*\Delta_{re}} = \frac{1}{F_{re}*\left[1+\frac{\delta_{re}}{2}*M(t)\right]*\Delta_{re}} = \frac{f_{re}}{1+\frac{\delta_{re}}{2}*M(t)},$$

where f(M(t)) represents the spread spectrum frequency, F(t) represents the target frequency control word, $$F(t) = F_{re} * \left[1 + \frac{\delta_{re}}{2} * M(t)\right],$$

$F_{re}$ represents the reference frequency control word, $\delta_{re}$ represents the reference spread spectrum depth coefficient, M(t) represents the modulation function, $\Delta_{re}$ represents the reference base time unit, and $f_{re}$ represents a frequency corresponding to the reference frequency control word.

For example, in the clock spread spectrum method provided by some embodiments of the present disclosure, the modulation function is an original modulation function, and the modulation function is expressed as: $M(t)=\xi(t)$, where $\xi(t)$ represents the original modulation function; or, the modulation function is a compensation modulation function after compensating for the original modulation function, and the modulation function is expressed as:

$$M(t) = E(\xi(t)) = \frac{\xi(t)}{1 - \frac{\delta_{re}}{2} * \xi(t)},$$

or $$M(t) = E(\xi(t)) = \frac{-\xi(t)}{1 + \frac{\delta_{re}}{2} * \xi(t)},$$

where $E(\xi(t))$ represents the compensation modulation function, and $\xi(t)$ represents the original modulation function.

For example, in the clock spread spectrum method provided by some embodiments of the present disclosure, the modulation mode includes a triangle modulation mode, a sawtooth modulation mode, a sinusoidal modulation mode, or a random modulation mode.

For example, in the clock spread spectrum method provided by some embodiments of the present disclosure, a maximum value Fmax of the target frequency control word and a minimum value Fmin of the target frequency control word satisfy a following formula: $0 \leq Fmax-Fmin < 1$.

At least some embodiments of the present disclosure further provide a parameter determination device for a spread spectrum circuit, and the parameter determination device for the spread spectrum circuit includes: a memory, configured to store computer readable instructions; and a processor, configured to execute the computer readable instructions and perform the parameter determination method for the spread spectrum circuit according to any one of the above embodiments when the computer readable instructions are executed by the processor.

At least some embodiments of the present disclosure further provide a clock spread spectrum device, and the clock spread spectrum device includes: a memory, configured to store computer readable instructions; and a processor, configured to execute the computer readable instructions and perform the clock spread spectrum method according to any one of the above embodiments when the computer readable instructions are executed by the processor.

BRIEF DESCRIPTION OF THE DRAWINGS

In order to clearly illustrate the technical solution of the embodiments of the present disclosure, the drawings of the embodiments will be briefly described in the following. It is obvious that the described drawings in the following are only related to some embodiments of the present disclosure and thus are not limitative of the present disclosure.

DETAILED DESCRIPTION

Figure 1:
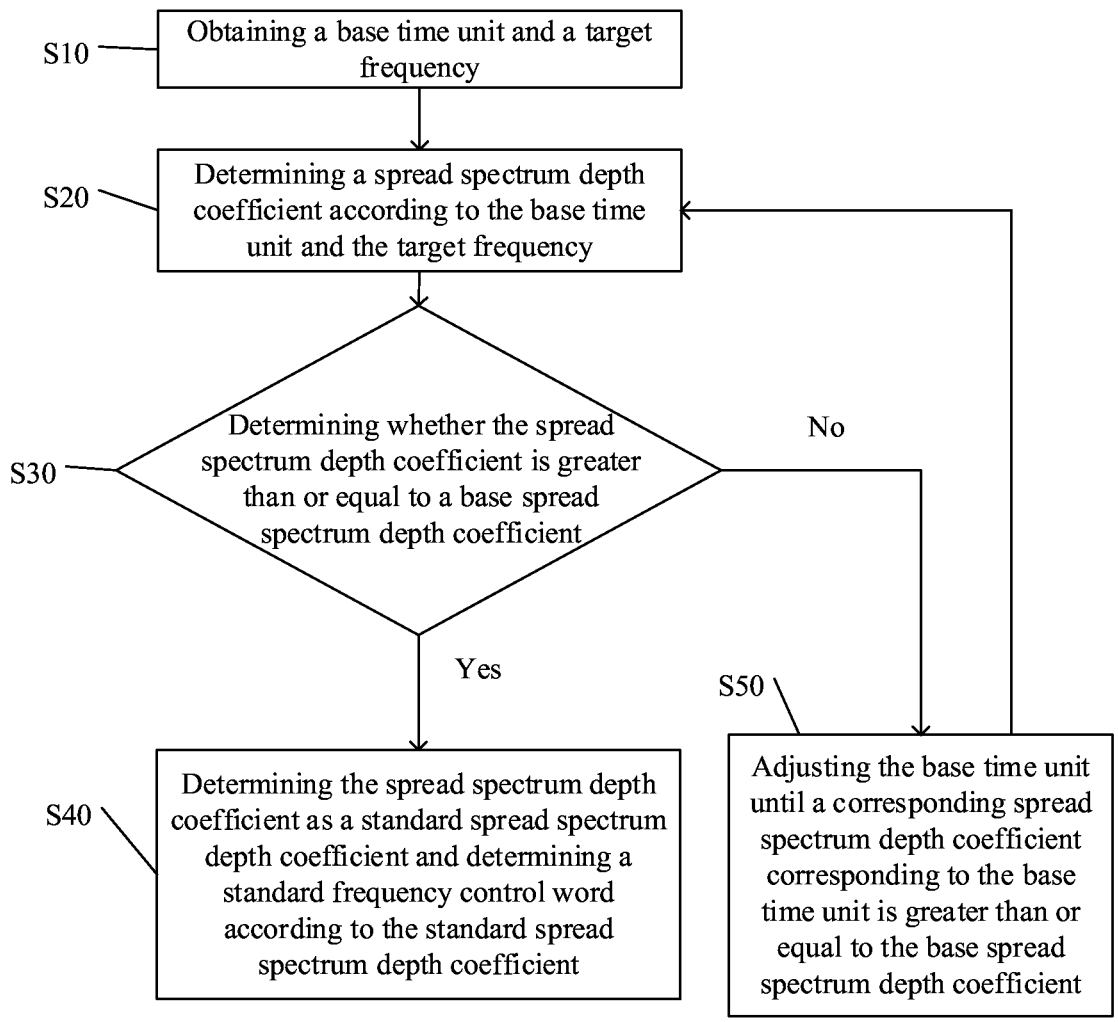
FIG. 1 is a flowchart of a parameter determination method for a spread spectrum circuit provided by some embodiments of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", "coupled", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In order to keep the following descriptions of the embodiments of the present disclosure clear and concise, the present disclosure omits detailed descriptions of some known functions and known components.

With the development of technology, the frequency of clock signals is getting higher and higher, and high frequency clock signals have strong electromagnetic interference (EMI). Although theoretical analysis shows that a larger modulation depth (i.e., a frequency shift range) can definitely provide better EMI inhibitory effects, however, because of the limitation of various factors (for example, a circuit structure, a working process, etc.), in practical design, the design of the modulation depth is very conservative, that is, the modulation depth has a certain range limitation and cannot be designed to be very large. Limited by traditional clock generators, especially the difficulty in implementing a closed-loop solution based on the phase locked loop (PLL), it is currently impossible to achieve the desired large dynamic frequency range without affecting the normal operation of the driven circuit. Because the frequency of the signal output by the traditional clock generator after the spread spectrum of the traditional clock generator is turned on has a large uncertainty, general application scenarios only tend to use the down spread spectrum for spreading spectrum among the spread spectrum boundary types (the spread spectrum boundary types include the central spread spectrum, the up spread spectrum, and the down spread spectrum), because after performing spread spectrum in this way, the frequency of the signal is only modulated in a direction lower than the original frequency of the signal, which theoretically may not break the time constraints of the existing circuit design. It can be seen that, based on the clock spread spectrum of the traditional clock generator, both the spread spectrum depth coefficient and the spread spectrum boundary type are limited.

At least some embodiments of the present disclosure provide a parameter determination method for a spread spectrum circuit, a clock spread spectrum method, a parameter determination device for a spread spectrum circuit, and a clock spread spectrum device. The parameter determination method for the spread spectrum circuit includes: obtaining a base time unit and a target frequency; determining a spread spectrum depth coefficient according to the base time unit and the target frequency; determining whether the spread spectrum depth coefficient is greater than or equal to a base spread spectrum depth coefficient; adjusting the base time unit until a corresponding spread spectrum depth coefficient corresponding to the base time unit is greater than or equal to the base spread spectrum depth coefficient in a case where the spread spectrum depth coefficient is smaller than the base spread spectrum depth coefficient; and determining the spread spectrum depth coefficient as a standard spread spectrum depth coefficient and determining a standard frequency control word according to the standard spread spectrum depth coefficient in a case where the spread spectrum depth coefficient is greater than or equal to the base spread spectrum depth coefficient.

In the parameter determination method for the spread spectrum circuit provided by the embodiments of the present disclosure, based on time-average-frequency direct-period-synthesis (TAF-DPS) technology, a spread spectrum clock signal is generated using TAF-DPS, and the period of the spread spectrum clock signal is composed of only two periods. Therefore, the problem of uncontrolled clock quality can be solved when the spread spectrum depth coefficient increases; and when designing a digital circuit, only a short period is required to constrain the setup time, so that the selection of the spread spectrum boundary can be made flexibly. In this way, the spread spectrum boundary is automatically adjusted according to the frequency control word corresponding to the required frequency, and the spread spectrum depth coefficient is not limited by the clock circuit, which can maximize the spread spectrum depth coefficient without affecting the quality of the output clock signal, solve the problem of the limitation of the traditional spread spectrum clock modulation depth, and significantly improve the ability to inhibit EMI. In addition, the method can be applied to all types of spread spectrum modulation curve shapes.

Hereinafter, the embodiments of the present disclosure are described in detail with reference to the accompanying drawings, but the present disclosure is not limited to these specific embodiments.

Figure 2:
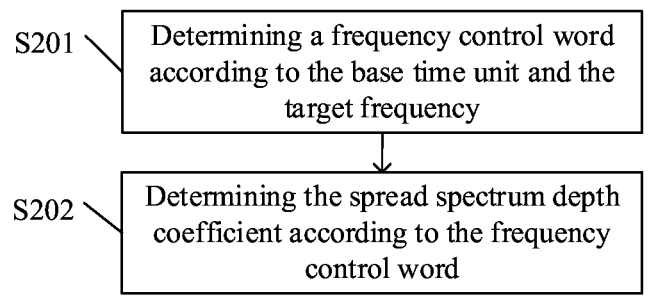
FIG. 2 is a flowchart of determining a spread spectrum depth coefficient provided by some embodiments of the present disclosure.

FIG. 1 is a flowchart of a parameter determination method for a spread spectrum circuit provided by some embodiments of the present disclosure, and FIG. 2 is a flowchart of determining a spread spectrum depth coefficient provided by some embodiments of the present disclosure.

For example, as illustrated in FIG. 1, the parameter determination method for the spread spectrum circuit provided by some embodiments of the present disclosure may include the following steps.

Step S10: obtaining a base time unit and a target frequency.

Step S20: determining a spread spectrum depth coefficient according to the base time unit and the target frequency.

Step S30: determining whether the spread spectrum depth coefficient is greater than or equal to a base spread spectrum depth coefficient.

In the case where the spread spectrum depth coefficient is greater than or equal to the base spread spectrum depth coefficient, step S40 is performed, that is, the spread spectrum depth coefficient is determined as a standard spread spectrum depth coefficient, and a standard frequency control word is determined according to the standard spread spectrum depth coefficient.

In the case where the spread spectrum depth coefficient is smaller than the base spread spectrum depth coefficient, step S50 is performed, that is, the base time unit is adjusted until a corresponding spread spectrum depth coefficient corresponding to the base time unit is greater than or equal to the base spread spectrum depth coefficient.

The parameter determination method for the spread spectrum circuit provided by the embodiments of the present disclosure can be applied to various circuit systems, and the circuit systems may include a clock spread spectrum circuit based on the time-average-frequency direct-period-synthesis (TAF-DPS) technology. Based on the TAF-DPS technology, the spread spectrum function of various modulation modes can be enabled by the same clock spread spectrum circuit, and no extra noise is introduced when the spread spectrum function is turned on, that is, in the case of without affecting the normal operation of the circuit system, a large frequency dynamic adjustment range can be achieved, which may solve the problem of the limitation of the traditional spread spectrum clock modulation depth and significantly improve the electromagnetic interference inhibition performance of the circuit system.

For example, in step S10, the target frequency is the operating frequency of the circuit system, and the operating frequency can be set according to the requirements of users, that is, the target frequency can be determined by the user based on the operating requirements of the circuit system. In the parameter determination method for the spread spectrum circuit provided by the embodiments of the present disclosure, the target frequency remains unchanged.

For example, the circuit system may include a base time unit generator, and in step S10, the base time unit may be generated by the base time unit generator. The base time unit generator may include a base time unit generating sub-circuit and an adjusting sub-circuit. The base time unit generating sub-circuit may generate an initial base time unit. The initial base time unit may be a fixed period clock provided by the circuit system, and the base time unit generating sub-circuit may include a crystal oscillator (for example, an active crystal oscillator and a passive crystal oscillator), a phase locked loop (PLL), a delay locked loop (DLL), a Johnson counter, etc. The adjusting sub-circuit may perform initial adjustment on the initial base time unit to obtain the base time unit. Alternatively, the initial base time unit may be obtained and determined as the base time unit in step S10. For example, the adjusting sub-circuit may include a frequency divider, a frequency multiplier, etc., so as to perform operations such as frequency division or frequency multiplication on the initial base time unit.

For example, as illustrated in FIG. 2, in step S20, determining the spread spectrum depth coefficient may include the following steps.

Step S201: determining a frequency control word according to the base time unit and the target frequency.

Step S202: determining the spread spectrum depth coefficient according to the frequency control word.

For example, in step S201, the frequency control word may be expressed as:

$$F_T = 1/(f_T * \Delta_0) = I_{ad} + r_{ad} \tag{1},$$

where $F_T$ represents the frequency control word, $f_T$ represents the target frequency, $\Delta_0$ represents the base time unit, $I_{ad}$ represents an integer part of the frequency control word, and $r_{ad}$ represents a decimal part of the frequency control word. In a case where the target frequency does not change, the frequency control word can be adjusted by adjusting the base time unit.

For example, the spread spectrum depth coefficient may represent a coefficient corresponding to a maximum spread spectrum depth corresponding to the target frequency. In some embodiments, if the target frequency is 100 MHz, and the maximum spread spectrum depth corresponding to the target frequency is 20 MHz, that is, the frequency range after spreading spectrum is 90 MHz to 110 MHz, the spread spectrum depth coefficient may be 0.2 (that is, the maximum spread spectrum depth/target frequency).

For example, step S202 may include: determining a spread spectrum manner, and determining the spread spectrum depth coefficient according to the spread spectrum manner and the frequency control word.

For example, in step S202, in the case where the spread spectrum manner is determined, the spread spectrum depth coefficient is determined based on the frequency control word, so that adjusting the frequency control word can implement the adjustment of the spread spectrum depth coefficient.

For example, the spread spectrum manner may include a boundary spread spectrum, a central spread spectrum, an up spread spectrum, or a down spread spectrum. The spread spectrum manner can be determined by the user according to requirements. The boundary spread spectrum is a spread spectrum manner based on the characteristics of the TAF-DPS clock generating circuit, and the target of the boundary spread spectrum is to maximize the spread spectrum depth, thereby effectively reducing the EMI effect and simultaneously controlling the effect of the clock on the circuit system accurately, so that the problem of uncontrolled clock quality can be solved when the spread spectrum depth increases. The clock spread spectrum circuit can maximize the spread spectrum depth based on the boundary spread spectrum, thereby enhancing the ability to inhibit EMI without affecting the normal operation of the circuit system.

In a case where the circuit system uses the clock spread spectrum circuit based on the TAF-DPS to perform clock spread spectrum, in order to ensure that the normal operation of the circuit system is not affected, the period of the signal generated by the clock spread spectrum circuit only has two period types when the spread spectrum function of the circuit system is enabled and not enabled, so that the difference between the maximum value and the minimum value of the frequency control word corresponding to the clock signal is not greater than 1, that is, the frequency control word changes between two integers. Based on the above, the expressions of the spread spectrum depth coefficient in different spread spectrum manners are discussed below.

For example, in the case where the spread spectrum manner is the boundary spread spectrum, the spread spectrum depth coefficient is expressed as:

$$\delta_{max} = \frac{1}{I_{ad} + 0.5}. \tag{2}$$

In the case where the spread spectrum manner is the central spread spectrum, the spread spectrum depth coefficient is expressed as:

$$\delta_{max} < \frac{2*(1-r_{ad})}{I_{ad}+r_{ad}}, \tag{3}$$

and $$\delta_{max} \leq \frac{2*r_{ad}}{I_{ad}+r_{ad}}. \tag{4}$$

In the case where the spread spectrum manner is the up spread spectrum, the spread spectrum depth coefficient is expressed as:

$$\delta_{max} \leq \frac{r_{ad}}{I_{ad}+r_{ad}}. \tag{5}$$

In the case where the spread spectrum manner is the down spread spectrum, the spread spectrum depth coefficient is expressed as:

$$\delta_{max} < \frac{1-r_{ad}}{I_{ad}+r_{ad}}. \quad (6)$$

Among them, $\delta_{max}$ represents the spread spectrum depth coefficient, $I_{ad}$ is an integer part of the frequency control word $F_T$ in the above formula (1), and $r_{ad}$ is a decimal part of the frequency control word $F_T$ in the above formula (1).

For example, in the case where the spread spectrum manner is the central spread spectrum, if $r_{ad}$ is greater than or equal to 0.5, the spread spectrum depth coefficient is determined by formula (3), and if $r_{ad}$ is less than 0.5, the spread spectrum depth coefficient is determined by formula (4).

For example, in step S30, the base spread spectrum depth coefficient may be determined by the user according to practical requirements. The larger the base spread spectrum depth coefficient, the larger the standard spread spectrum depth coefficient obtained, and the better the effect of inhibiting EMI. For example, in the case where the circuit system needs to have a strong ability to suppress EMI, the user can set a large base spread spectrum depth coefficient.

For example, in the case where the spread spectrum depth coefficient is greater than or equal to the base spread spectrum depth coefficient, the spread spectrum clock signal generated based on the current base time unit can satisfy the effect of inhibiting EMI required by the user. Therefore, in step S40, the current spread spectrum depth coefficient can be the standard spread spectrum depth coefficient, and the current base time unit can be the standard base time unit.

For example, in step S40, determining the standard frequency control word according to the standard spread spectrum depth coefficient includes: determining the integer part and the decimal part of the standard frequency control word according to the standard spread spectrum depth coefficient.

For example, the standard frequency control word can be expressed as: $F_r=I_r+r_r$, $F_r$ represents the standard frequency control word, $I_r$ represents the integer part of the standard frequency control word $F_r$, and $r_r$ represents the decimal part of the standard frequency control word $F_r$. For example, in the case where the spread spectrum depth coefficient is greater than or equal to the base spread spectrum depth coefficient, and the spread spectrum depth coefficient is determined as the standard spread spectrum depth coefficient, that is, when the standard spread spectrum depth coefficient is the above spread spectrum depth coefficient $\delta_{max}$, the integer part and the decimal part of the standard frequency control word $F_r$ can be determined according to the above formulas (2) to (6). For example, in the case where the spread spectrum manner is the boundary spread spectrum, the integer part of the standard frequency control word is $I_r=I_{ad}$, and the decimal part of the standard frequency control word is $r_r=0.5$, that is, in the case where the spread spectrum manner is the boundary spread spectrum, the standard frequency control word is $F_r=I_r+0.5$, and the integer part of the standard frequency control word $F_r$ is the same as the integer part of the above frequency control word $F_T$. In the case where the spread spectrum manner is the central spread spectrum, the up spread spectrum, or the down spread spectrum, the integer part of the standard frequency control word $F_r$ is $I_r=I_{ad}$, and the decimal part of the standard frequency control word $F_r$ is $r_r=r_{ad}$, that is, in the case where the spread spectrum manner is the central spread spectrum, the up spread spectrum, or the down spread spectrum, the standard frequency control word $F_r$ is the above frequency control word $F_T$.

For example, in step S40, in the case where the spread spectrum depth coefficient is greater than or equal to the base spread spectrum depth coefficient, the base time unit is determined as a standard base time unit, the standard frequency control word $F_r$ corresponds to a reference frequency, that is, the reference frequency is a frequency corresponding to the standard frequency control word, and the reference frequency can be expressed as:

$$f_s^r = f_T * \frac{F_T}{F_r},$$

where $f_s^r$ represents the reference frequency.

For example, with reference to the above formulas (2) to (6), in the case where the spread spectrum manner is the boundary spread spectrum, the reference frequency $f_s^r$ represents a frequency corresponding to the standard frequency control word $I_{ad}+0.5$. In the case where the spread spectrum manner is the central spread spectrum, the up spread spectrum, or the down spread spectrum, the reference frequency $f_s^r$ represents a frequency corresponding to the standard frequency control word $I_{ad}+r_{ad}$. That is, in the case where the spread spectrum manner is the central spread spectrum, the up spread spectrum, or the down spread spectrum, the reference frequency $f_s^r$ is equal to the target frequency $f_T$.

For example, based on the TAF-DPS principle, the standard frequency control word can be expressed as:

$$F_r=1/(f_s^r=I_r+r_r \quad (7).$$

Among them, $F_r$ represents the standard frequency control word, and Ai represents the standard base time unit. That is, the reference frequency $f_s^r$ can further be expressed as: $f_s^r=1/(\Delta_1 *F_r)$. For example, because the standard frequency control word $F_r$ is the frequency control word corresponding to the reference frequency $f_s^r$, with reference to the above formula (2), in the case where the spread spectrum manner is the boundary spread spectrum, the integer part of the standard frequency control word $F_r$ is the same as the integer part of the frequency control word $F_T$, that is, $I_r=I_{ad}$, and the decimal part $r_r$ of the standard frequency control word $F_r$ can be 0.5. In this case, the reference frequency $f_s^r$ is expressed as: $f_s^r=1/(\Delta_1 *F_r)=1/((I_{ad}+0.5)*\Delta_1)=\delta_{max}/\Delta_1$.

For example, in the case where the spread spectrum depth coefficient is smaller than the base spread spectrum depth coefficient, the spread spectrum clock signal generated based on the current base time unit cannot satisfy the effect of inhibiting EMI required by the user, so that in step S50, the current base time unit needs to be adjusted to allow the spread spectrum depth coefficient to be increased. For example, in step S50, the adjusting sub-circuit in the base time unit generator may adjust the current base time unit.

For example, for the boundary spread spectrum, according to the above formulas (1) and (2), it can be seen that, in the case where the target frequency $f_T$ is unchanged, when the base time unit $\Delta_0$ increases, the frequency control word $F_T$ corresponding to the target frequency $f_T$ decreases, so that the integer part $I_{ad}$ of the frequency control word $F_T$ may also decrease. Therefore, the spread spectrum depth coefficient increases, that is, when the base time unit increases, the spread spectrum depth coefficient also increases, and the base time unit is in positive correlation with the spread spectrum depth coefficient. Therefore, in step S50, the adjusting sub-circuit may adjust the current base time unit to allow the adjusted base time unit to be greater than the current base time unit, so that the spread spectrum depth coefficient determined based on the adjusted base time unit is greater than the spread spectrum depth coefficient determined based on the current base time unit.

It should be noted that, before the base time unit is adjusted, the "current base time unit" may represent the base time unit obtained in step S10, and the current base time unit may be the initial base time unit generated by the base time unit generating sub-circuit, or may be the base time unit obtained after performing the initial adjustment on the initial base time unit by a regulating sub-circuit. After performing the first adjustment on the current base time unit (that is, the base time unit obtained in step S10), that is, after performing the step of modulating the base time unit in step S50 once, a first adjusted base time unit can be obtained. In this case, the "current base time unit" may represent the first adjusted base time unit. After performing the second adjustment on the current base time unit (that is, the first adjusted base time unit), that is, after performing the step of modulating the base time unit in step S50 twice, a second adjusted base time unit can be obtained. In this case, the "current base time unit" may represent the second adjusted base time unit, and so on.

For example, subsequent to step S50, after the base time unit is adjusted, the method may return to step S20, and comprises determining the spread spectrum depth coefficient based on the adjusted base time unit and the target frequency. For example, after the base time unit is adjusted once, the first adjusted base time unit is obtained; and then, a corresponding spread spectrum depth coefficient corresponding to the first adjusted base time unit is re-determined based on the first adjusted base time unit and the target frequency.

For example, in step S50, the current base time unit may be repeatedly adjusted until the adjusted spread spectrum depth coefficient determined according to the adjusted base time unit is greater than or equal to the base spread spectrum depth coefficient.

It should be noted that, in step S50, every time the base time unit is adjusted, the method needs to return to step S20 and repeatedly performs each of the above steps S20 to S50 (it should be noted that, according to the actual situation, step S40 may not be performed, and step S50 may also not be performed). For example, after adjusting the base time unit, the method may return to step S20, and perform the step of determining the corresponding spread spectrum depth coefficient according to the base time unit and the target frequency. Then, step S30 is performed, that is, determining whether the corresponding spread spectrum depth coefficient is greater than the base spread spectrum depth coefficient, and step S40 or S50 is performed according to the determination result. In the case where the determination result indicates that the corresponding spread spectrum depth coefficient is greater than or equal to the base spread spectrum depth coefficient, step S40 is performed; and in the case where the determination result indicates that the corresponding spread spectrum depth coefficient is less than the base spread spectrum depth coefficient, step S50 is performed. The above steps S20 to S50 are performed in loop.

For example, in some examples, in step S50, the first adjustment is performed on the base time unit to obtain the first adjusted base time unit. The first adjusted base time unit serves as the current base time unit. Then, step S20 is performed, and a first adjusted spread spectrum depth coefficient is determined according to the current base time unit (i.e., the first adjusted base time unit) and the target frequency. Then, step S30 is performed to judge whether the first adjusted spread spectrum depth coefficient is greater than or equal to the base spread spectrum depth coefficient.

In the case where the first adjusted spread spectrum depth coefficient is greater than or equal to the base spread spectrum depth coefficient, the first adjusted spread spectrum depth coefficient is determined as the standard spread spectrum depth coefficient, the first adjusted base time unit is determined as the standard base time unit, and the standard frequency control word is determined according to the standard spread spectrum depth coefficient and the standard base time unit. In the case where the first adjusted spread spectrum depth coefficient is less than the base spread spectrum depth coefficient, step S50 is performed to adjust the current base time unit (i.e., the first adjusted base time unit) to obtain a second adjusted base time unit, and the second adjusted base time unit serves as the current base time unit. Then, the above steps S20 to S50 are repeatedly performed based on the second adjusted base time unit. By analogy, for example, until the Nth adjusted spread spectrum depth coefficient determined based on the Nth adjusted base time unit is greater than or equal to the base spread spectrum depth coefficient, the above cycle process is ended. N is a natural number.

Some embodiments of the present disclosure further provide a clock spread spectrum method, and the clock spread spectrum method is implemented based on the parameter determination method for the spread spectrum circuit provided by any one of the above embodiments.

Figure 3:
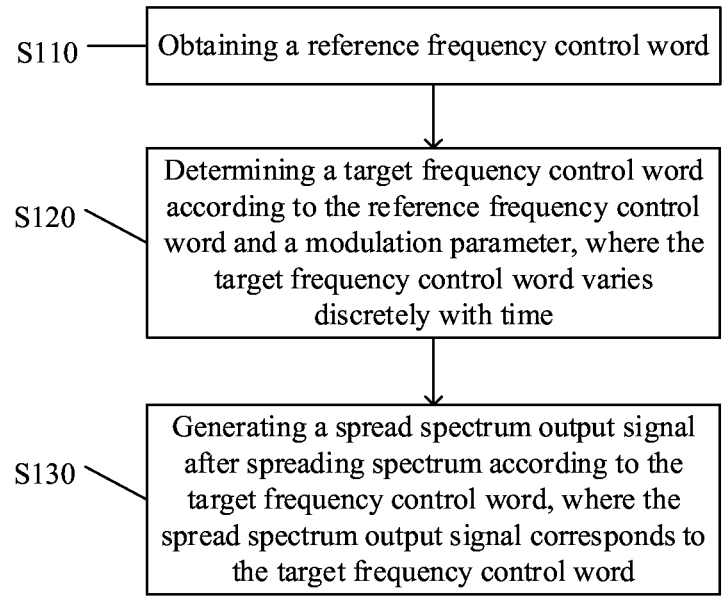
FIG. 3 is a flowchart of a clock spread spectrum method provided by some embodiments of the present disclosure.
Figure 4:
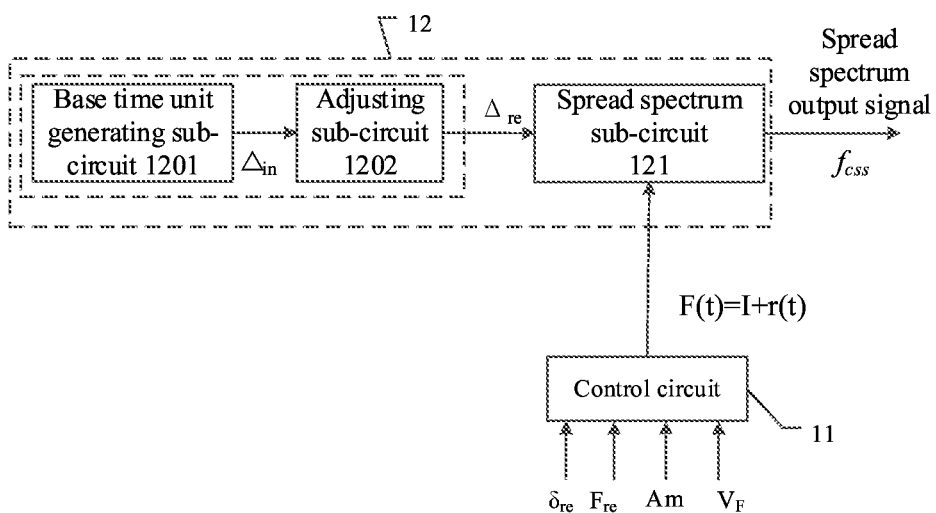
FIG. 4 is a schematic block diagram of a clock spread spectrum circuit provided by some embodiments of the present disclosure.

FIG. 3 is a flowchart of a clock spread spectrum method provided by some embodiments of the present disclosure, and FIG. 4 is a schematic block diagram of a clock spread spectrum circuit provided by some embodiments of the present disclosure.

For example, as illustrated in FIG. 3, the clock spread spectrum method provided by the embodiments of the present disclosure may include the following steps.

Step S110: obtaining a reference frequency control word.

Step S120: determining a target frequency control word according to the reference frequency control word and a modulation parameter, where the target frequency control word varies discretely with time.

Step S130: generating a spread spectrum output signal after spreading spectrum according to the target frequency control word, where the spread spectrum output signal corresponds to the target frequency control word.

In the clock spread spectrum method provided by the embodiments of the present disclosure, the spread spectrum output signal may be composed of two signals with determined periods, and the spread spectrum boundary of the spread spectrum output signal is automatically adjusted according to the target frequency control word, which can achieve a large frequency dynamic adjustment range on the premise of not affecting the spread spectrum output signal that is output, solve the problem of limitation of the spread spectrum clock modulation depth, and significantly improve the performance of inhibiting EMI.

For example, in step S110, the reference frequency control word is the standard frequency control word obtained according to the parameter determination method for the spread spectrum circuit according to any one of the above embodiments.

The clock spread spectrum method provided by the embodiments of the present disclosure can be applied to a clock spread spectrum circuit based on the TAF-DPS, and the clock spread spectrum circuit and the clock spread spectrum method based on the TAF-DPS provided by the embodiments of the present disclosure are described below with reference to FIG. 4.

For example, as illustrated in FIG. 4, the clock spread spectrum circuit may include a control circuit 11 and a signal generating circuit 12. The control circuit 11 is configured to generate a target frequency control word according to the reference frequency control word and the modulation parameter, and the signal generating circuit 12 is configured to generate and output a spread spectrum output signal after spreading spectrum according to the target frequency control word. That is, the above steps S110 and S120 may be performed by the control circuit 11, and the above step S130 may be performed by the signal generating circuit 12.

For example, the control circuit 11 may be implemented in a hardware manner or a combination of hardware and software.

For example, as illustrated in FIG. 4, in step S120, the modulation parameter may include a reference spread spectrum depth coefficient Ere corresponding to the spread spectrum output signal, a modulation rate $V_F$, a modulation mode Am, etc.

For example, the reference spread spectrum depth coefficient $\delta_{re}$ represents the modulation amplitude. The reference spread spectrum depth coefficient $\delta_{re}$ is the standard spread spectrum depth coefficient obtained according to the parameter determination method for the spread spectrum circuit according to any one of the above embodiments. It should be noted that, for related descriptions of the standard frequency control word and the standard spread spectrum depth coefficient, reference can be made to the related descriptions in the above embodiments of the parameter determination method for the spread spectrum circuit, and duplicated details are not described herein again.

For example, the modulation rate $V_F$ represents the speed, which varies with time, of the target frequency control word.

For example, the modulation mode $A_m$ may include a triangle modulation mode, a sinusoidal modulation mode, a random modulation mode, a sawtooth modulation mode, etc. The user can select the corresponding modulation mode according to practical application requirements. For example, different clock spread spectrum circuits can correspond to different modulation modes. But the present disclosure is not limited to this case, and different clock spread spectrum circuits may also correspond to the same modulation mode. For example, the same clock spread spectrum circuit may correspond to different modulation modes, and different modulation modes may correspond to different application scenarios of the clock spread spectrum circuit, respectively. The present disclosure does not specifically limit the type of the modulation mode, the selection manner, etc.

For example, in some embodiments, the reference spread spectrum depth coefficient $\delta_{re}$, the modulation mode $A_m$, and the modulation rate $V_F$ may be set by the user according to practical requirements.

For example, as illustrated in FIG. 4, the control circuit 11 may generate the target frequency control word according to the reference spread spectrum depth coefficient $\delta_{re}$, the reference frequency control word $F_{re}$, the modulation mode $A_m$, and the modulation rate $V_F$.

For example, based on the reference spread spectrum depth coefficient $\delta_{re}$ and the modulation mode $A_m$, the expression of the frequency of the spread spectrum output signal after the spreading spectrum can be expressed as:

$$f_s = f_{re} * \left[1 + \frac{\delta_{re}}{2} * M(t)\right],$$

where $f_s$ represents the frequency of the spread spectrum output signal, $f_{re}$ may represent the frequency corresponding to the reference frequency control word $F_{re}$, $\delta_{re}$ represents the reference spread spectrum depth coefficient, M(t) represents a modulation function determined according to the modulation mode $A_m$, and t represents time. The frequency of the spread spectrum output signal generated based on the TAF-DPS is in one-to-one correspondence and inversely proportional to the frequency control word, and has a small linear property. Therefore, in a case where the clock spread spectrum circuit based on the TAF-DPS is applied to clock spread spectrum, the frequency control word can be directly modulated by using the modulation form with the same frequency as the spread spectrum output signal.

For example, based on the above analysis, in step S120, the target frequency control word is expressed as:

$$F(t) = I + r(t) = F_{re} * \left[1 + \frac{\delta_{re}}{2} * M(t)\right], \tag{8}$$

where F(t) is the target frequency control word, I is the integer part of the target frequency control word, r(t) is the decimal part of the target frequency control word, r(t) varies discretely with time, and $F_{re}$ represents the reference frequency control word, that is, the standard frequency control word in the above formula (7).

For example, the range of r(t) is [0, 1], that is, r(t) varies between 0 and 1, and r(t) can be 0, but cannot be 1, so that the target frequency control word F(t) varies between two integers. The maximum value of the target frequency control word and the minimum value of the target frequency control word satisfy the following formula:

0≤Fmax−Fmin<1, where Fmin represents the minimum value of the frequency control word, and Fmax represents the maximum value of the frequency control word.

For example, the integer part I of the target frequency control word F(t) is determined by the reference frequency control word $F_{re}$. The decimal part r(t) of the target frequency control word F(t) is determined by the reference spread spectrum depth coefficient $\delta_{re}$, the reference frequency control word $F_{re}$, the modulation mode $A_m$, and the modulation rate $V_F$. For example, with reference to the above formula (7), the integer part I of the target frequency control word F(t) can be the integer part $I_r$ of the standard frequency control word $F_r$ (that is, the reference frequency control word $F_{re}$). In order to ensure the quality of the spread spectrum output signal that is output, the integer part I of the target frequency control word F(t) remains unchanged during the spread spectrum process.

For example, the reference spread spectrum depth coefficient $\delta_{re}$ is a positive number.

For example, the reference spread spectrum depth coefficient $\delta_{re}$, the reference frequency control word $F_{re}$, the modulation mode $A_m$, and the modulation rate $V_F$ can be directly input to the control circuit 11 through the data interface by the user through an input device (e.g., a keyboard, a touch screen, a touch pad, a mouse, a knob, etc.).

For example, the control circuit 11 may include a modulation mode sub-circuit, and the modulation mode sub-circuit is configured to generate the time series of the modulation function M(t) with different shapes (e.g., a triangle wave shape, a sinusoidal wave shape, a sawtooth wave shape, a random curve, etc.) by using any one of modulation modes such as a triangle modulation mode, a sawtooth modulation mode, a sinusoidal modulation mode, and a random modulation mode.

For example, the modulation mode sub-circuit may include a sequence logic module, a pseudo-random binary sequence (PRBS) module, a look-up table, etc. The sequence logic module may include an adder, a memory, a subtracter, a comparator, etc. For example, for the triangle modulation mode, the sawtooth modulation mode, and the sinusoidal modulation mode, the modulation function M(t) is an approximate curve that changes regularly. Therefore, the adder, the memory, the subtracter, the comparator, and the like can be used to generate the time series of the modulation function M(t). For the random modulation mode, the modulation function M(t) is composed of a series of irregularly varying random values. Therefore, the PRBS module can be used to generate the time series of the modulation function M(t), and the pseudo-random values generated by the PRBS module have a large cycle period, so that the pseudo-random values can be approximately considered that the pseudo-random values are in irregular variation. For example, a PRBS circuit may include a group of registers.

For example, the modulation function M(t) is a controlled function that varies with time, the varying curve of the modulation function M(t) is a modulation curve (for example, a sinusoidal wave curve, a triangle wave curve, a sawtooth wave curve, a Hershey-Kiss curve, a random curve, etc.), and different spread spectrum manners are determined by the varying range of the modulation function M(t). For example, in some embodiments, in the case where the spread spectrum manner is the central spread spectrum, the value range of the modulation function M(t) may be [−1, 1], that is, −1≤M(t)≤1. In the case where the spread spectrum manner is the up spread spectrum, the value range of the modulation function M(t) can be [0, 2], that is, 0≤M(t)≤2. In the case where the spread spectrum manner is the down spread spectrum, the value range of the modulation function M(t) can be [−2, 0], that is, −2≤M(t)≤0. However, the present disclosure is not limited to this case, and the value range of the modulation function M(t) can be set according to practical requirements. The present disclosure does not specifically limit such as the value range and form of the modulation function M(t).

For example, in some embodiments, the modulation function M(t) may be an original modulation function, and the modulation function M(t) may be expressed as:

$$M(t)=\xi(t) \quad (9),$$

where $\xi(t)$ represents the original modulation function. Therefore, the formula (9) is substituted into the above formula (8), and the target frequency control word can be obtained as:

$$F(t) = I + r(t) = F_{re} * \left[1 + \frac{\delta_{re}}{2} * \xi(t)\right].$$

For example, the original modulation function $\xi(t)$ is determined based on the modulation mode. For example, in the case where the modulation mode is the triangle modulation mode, the original modulation function $\xi(t)$ may be a trigonometric function; and in the case where the modulation mode is the sinusoidal modulation mode, the original modulation function $\xi(t)$ may be a sine function.

For example, step S130 may include: determining a reference base time unit, determining a modulation function according to the modulation mode, and determining the spread spectrum output signal based on the modulation function, the reference base time unit, and the target frequency control word.

For example, as illustrated in FIG. 4, the signal generating circuit 12 includes a base time unit generator 120 and a spread spectrum sub-circuit 121. The base time unit generator 120 is configured to generate and output a reference base time unit $\Delta_{re}$, and the reference base time unit $\Delta_{re}$ may be the standard base time unit $\Delta_1$ determined according to the parameter determination method for the spread spectrum circuit described above.

For example, the base time unit generator 120 includes a base time unit generating sub-circuit 1201 and an adjusting sub-circuit 1202.

For example, the base time unit generating sub-circuit 1201 is configured to generate and output an initial base time unit.

Figure 5A:
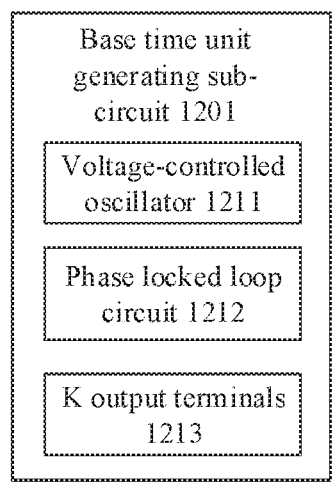
FIG. 5A is a schematic block diagram of a base time unit generating sub-circuit provided by some embodiments of the present disclosure.
Figure 5B:
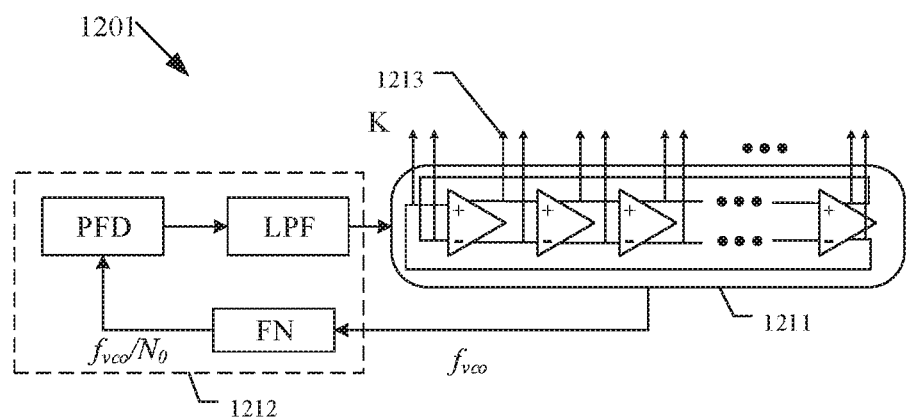
FIG. 5B is a schematic structural diagram of another base time unit generating sub-circuit provided by some embodiments of the present disclosure.
Figure 6:
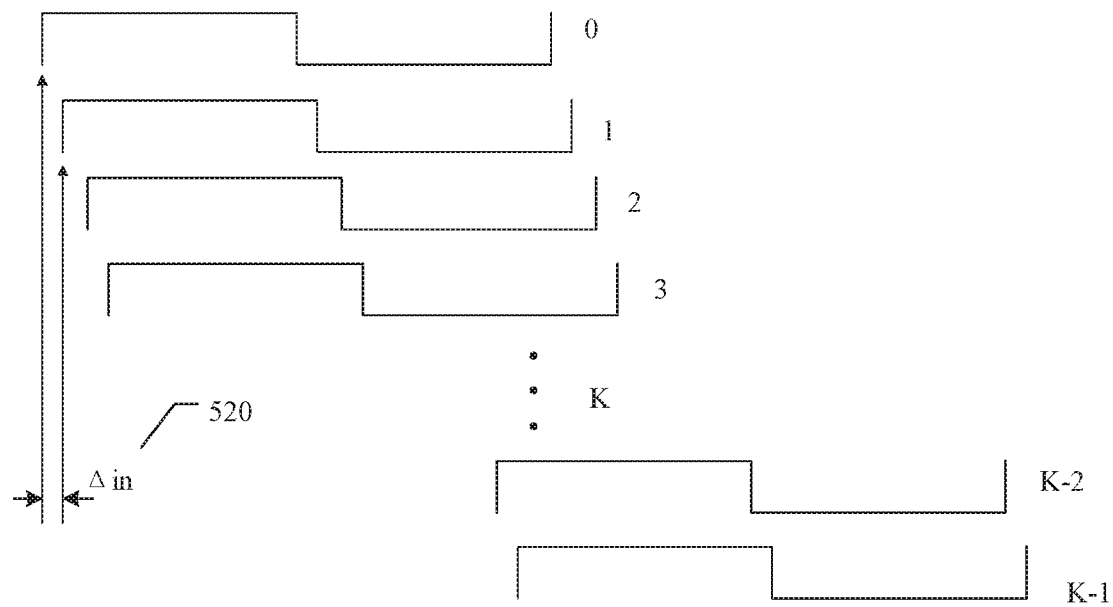
FIG. 6 is a schematic diagram of K base output signals with evenly spaced phase provided by some embodiments of the present disclosure.

FIG. 5A is a schematic block diagram of a base time unit generating sub-circuit provided by some embodiments of the present disclosure, FIG. 5B is a schematic structural diagram of another base time unit generating sub-circuit provided by some embodiments of the present disclosure, and FIG. 6 is a schematic diagram of K base output signals with evenly spaced phase provided by some embodiments of the present disclosure.

For example, the base time unit generating sub-circuit 1201 is configured to generate and output K base output signals with evenly spaced phase and an initial base time unit. The base time unit generating sub-circuit 1201 can generate the K base output signals with evenly spaced phase by using a phase locked loop (PLL), a delay locked loop (DLL), a Johnson counter, or the like. As illustrated in FIG. 5A, in some embodiments, the base time unit generating sub-circuit 1201 may include a voltage-controlled oscillator (VCO) 1211, a phase locked loop circuit 1212, and K output terminals 1213. The voltage-controlled oscillator 1211 is configured to oscillate at a predetermined oscillation frequency. The phase locked loop circuit 1212 is configured to lock the output frequency of the voltage-controlled oscillator 1211 at a base output frequency. The K output terminals 1213 are configured to output the K base output signals with evenly spaced phase, and K is a positive integer greater than 1. For example, K=16, 32, 128, or other values.

For example, the initial base time unit can be expressed as $\Delta_{in}$, and the initial base output frequency can be expressed as $f_d$. As illustrated in FIG. 6, the initial base time unit $\Delta_{in}$ is a time span between any two adjacent output signals output by the K output terminals 1203. The initial base time unit $\Delta_{in}$ is usually generated by a plurality of voltage-controlled oscillators 1211. The frequency $f_{vco}$ of the signal generated by the voltage-controlled oscillator 1211 can be locked at a known initial base output frequency $f_d$ through the phase locked loop circuit 1212, that is, $f_d = f_{vco}$.

For example, the initial base time unit $\Delta_{in}$ can be calculated by using the following formula:

$$\Delta_{in}=T_d/K=1/(K \cdot f_d),$$

where $T_d$ represents the period of the signal generated by the plurality of voltage-controlled oscillators 1211. The $f_A$ represents the value of the frequency of the initial base time unit, that is, $f_A=1/\Delta_{in}=K \cdot f_d$.

For example, as illustrated in FIG. 5B, the phase locked loop circuit 1212 includes a phase detector PFD, a loop filter LPF, and a frequency divider FN. For example, in the embodiments of the present disclosure, firstly, an input signal such as having an input frequency may be input to the phase detector, to the loop filter, and then to the voltage-controlled oscillator, and finally, the signal with the predetermined oscillation frequency $f_{vco}$ generated by the voltage-controlled oscillator can be divided through the frequency divider to obtain the division frequency $f_{vco}/N_0$ of the frequency divided signal, where $N_0$ represents the frequency division coefficient of the frequency divider, and $N_0$ is a real number and greater than or equal to 1. The division frequency $f_{vco}/N_0$ is fed back to the phase detector, and the phase detector is used to compare the input frequency of the reference signal with the division frequency $f_{vco}/N_0$. In the case where the input frequency and the division frequency $f_{vco}/N_0$ have the equal frequency and phase, the error between the input frequency and the division frequency $f_{vco}/N_0$ is zero. In this case, the phase locked loop circuit 1212 is in a locked state.

It should be noted that, the circuit structure illustrated in FIG. 5B is only an exemplary implementation of the base time unit generating sub-circuit 1201. The specific structure of the base time unit generating sub-circuit 1201 is not limited to this case, and the base time unit generating sub-circuit 1201 may also be constructed by other circuit structures, which is not limited in the present disclosure. For example, K and $\Delta_{in}$ can be predetermined according to practical requirements, and remain unchanged.

For example, the adjusting sub-circuit 1202 is configured to obtain the reference base time unit according to the initial base time unit. For example, in some examples, the adjusting sub-circuit 1202 is configured to adjust the initial base time unit $\Delta_{in}$ to obtain the reference base time unit $\Delta_{re}$. Alternatively, in other examples, the adjusting sub-circuit 1202 is configured to directly output the initial base time unit $\Delta_{re}$ as the reference base time unit $\Delta_{re}$.

Figure 7:
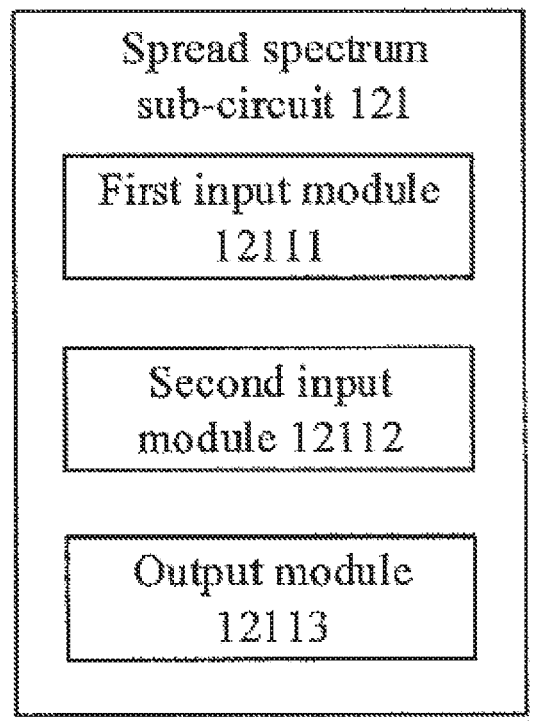
FIG. 7 is a schematic block diagram of a spread spectrum sub-circuit provided by some embodiments of the present disclosure.
Figure 8:
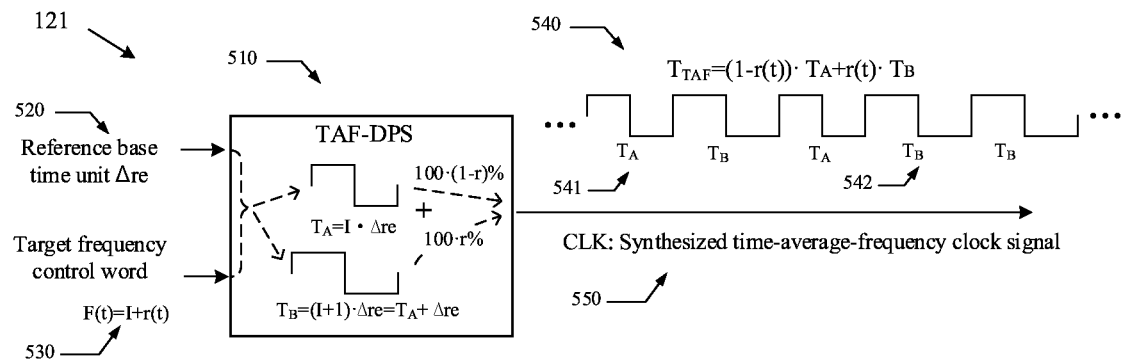
FIG. 8 is a schematic diagram of a working principle of a spread spectrum sub-circuit provided by some embodiments of the present disclosure.

FIG. 7 is a schematic block diagram of a spread spectrum sub-circuit provided by some embodiments of the present disclosure, and FIG. 8 is a schematic diagram of a working principle of a spread spectrum sub-circuit provided by some embodiments of the present disclosure.

For example, as illustrated in FIG. 7, the spread spectrum sub-circuit 121 includes a first input module 12111, a second input module 12112, and an output module 12113.

For example, the first input module 12111 is configured to receive the K base output signals with evenly spaced phase and the reference base time unit $\Delta_{re}$ from the base time unit generator 120. The second input module 12112 is configured to receive the target frequency control word F(t) from the control circuit 11. The output module 12113 is configured to generate a first period and a second period, generate a spread spectrum output signal according to the first period and the second period, and output the spread spectrum output signal. The occurrence probability of the first period and the second period is controlled by the value of the decimal part r(t) of the target frequency control word F(t).

For example, the spread spectrum sub-circuit 121 may include a time-average-frequency direct-period-synthesis (TAF-DPS) synthesizer, that is, the TAF-DPS synthesizer may be a specific implementation of the spread spectrum sub-circuit 121 in the embodiments of the present disclosure. For example, the TAF-DPS synthesizer can be implemented by using an application specific integrated circuit (for example, ASIC) or a programmable logic device (for example, FPGA). Alternatively, the TAF-DPS synthesizer can be implemented by using conventional analog circuit devices. The present disclosure is not limited in this aspect.

In the following, the working principle of the spread spectrum sub-circuit 121 based on the TAF-DPS synthesizer is described with reference to FIG. 8.

For example, as illustrated in FIG. 8, the spread spectrum sub-circuit 121 based on the TAF-DPS synthesizer 510 has two inputs: a reference base time unit 520 and a target frequency control word 530. The target frequency control word 530 is expressed as F(t), F(t)=I+r(t), I is an integer greater than 1, and r(t) is a fraction and varies discretely with time.

For example, the TAF-DPS synthesizer 510 has one output CLK 550. The output CLK 550 is a synthesized time-average-frequency clock signal. In the embodiments of the present disclosure, the output CLK 550 is the spread spectrum output signal. According to the reference base time unit 520, the TAF-DPS synthesizer 510 can generate two types of periods, that is, a first period $T_A = I \cdot \Delta_{re}$, and a second period $T_B = (I+1) \cdot \Delta_{re}$. The spread spectrum output signal CLK 550 is a clock pulse series 540, and the clock pulse series 540 is composed of a first period $T_A$ 541 and a second period $T_B$ 542 in an interleaved manner. The fraction r(t) is used to control the occurrence probability of the second period $T_B$, and therefore, r(t) can also determine the occurrence probability of the first period $T_A$.

For example, as illustrated in FIG. 8, the period $T_{TAF}$ of the spread spectrum output signal CLK 550 can be expressed by the following formula:

$$T_{TAF} = (1-r(t))T_A + r(t) \cdot T_B = T_A + r(t) \cdot (T_B - T_A) = T_A + r(t) \cdot \Delta_{re} = I \cdot \Delta_{re} + r(t) \cdot \Delta_{re} = (I+r(t)) \cdot \Delta_{re}$$

Therefore, in the case where the target frequency control word 530 is F(t)=I+r(t), it can be obtained that:

$$T_{TAF} = F(t) \cdot \Delta_{re} \quad (10)$$

For example, based on the above formula (10), the frequency $f_{css}$ of the spread spectrum output signal CLK 550 can be expressed as:

$$f_{css} = 1/T_{TAF} = 1/(F(t) \cdot \Delta_{re}) \quad (11)$$

From the above formulas (10) and (11), it can be seen that the period $T_{TAF}$ of the spread spectrum output signal CLK 550 output by the TAF-DPS synthesizer 510 is linearly proportional to the target frequency control word 530, and is in one-to-one correspondence with the target frequency control word 530. The frequency $f_{css}$ of the spread spectrum output signal CLK 550 is inversely proportional to the target frequency control word 530 and has a small linear shape. When the target frequency control word 530 changes, the period $T_{TAF}$ of the spread spectrum output signal CLK 550 output by the TAF-DPS synthesizer 510 also changes in the same form, and the frequency of the spread spectrum output signal CLK 550 also changes accordingly.

Figure 9A:
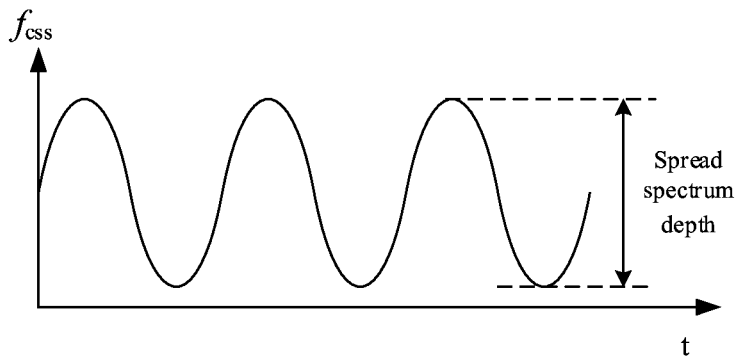
FIG. 9A is a schematic diagram of frequency modulation in a sinusoidal modulation mode provided by some embodiments of the present disclosure.
Figure 9B:
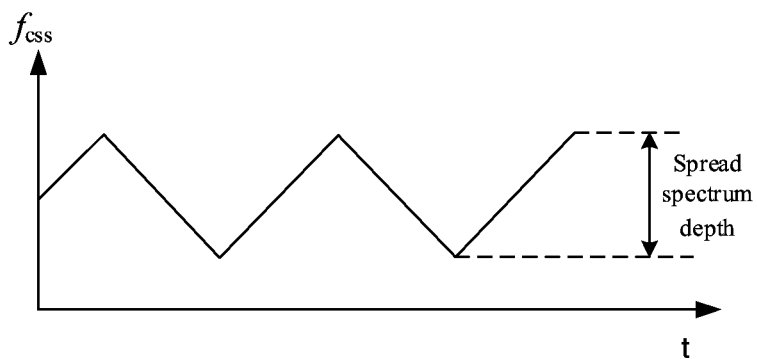
FIG. 9B is a schematic diagram of frequency modulation in a triangle modulation mode provided by some embodiments of the present disclosure.
Figure 9C:
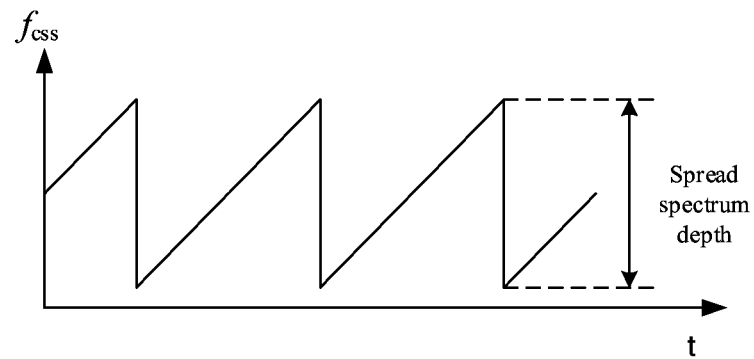
FIG. 9C is a schematic diagram of frequency modulation in a sawtooth modulation mode provided by some embodiments of the present disclosure.
Figure 9D:
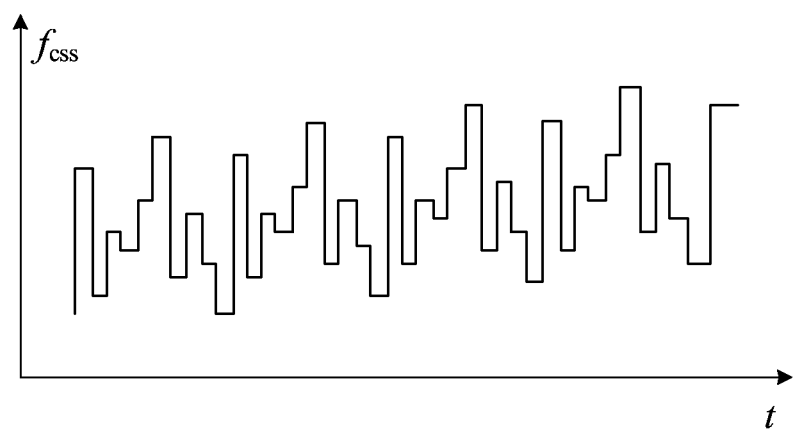
FIG. 9D is a schematic diagram of frequency modulation in a random modulation mode provided by some embodiments of the present disclosure.

FIG. 9A is a schematic diagram of frequency modulation in a sinusoidal modulation mode provided by some embodiments of the present disclosure, FIG. 9B is a schematic diagram of frequency modulation in a triangle modulation mode provided by some embodiments of the present disclosure, FIG. 9C is a schematic diagram of frequency modulation in a sawtooth modulation mode provided by some embodiments of the present disclosure, and FIG. 9D is a schematic diagram of frequency modulation in a random modulation mode provided by some embodiments of the present disclosure.

For example, in the sinusoidal modulation mode, when the time interval of the modulation function M(t) changing with time is short, the modulation function M(t) is approximately a sinusoidal wave curve, and thus, the target frequency control word F(t) is also approximately a sinusoidal wave curve. As illustrated in the formula (11), the frequency $f_{css}$ of the spread spectrum output signal based on the TAF-DPS is in a corresponding inverse form with the target frequency control word 530, and has a small linear property, so that as illustrated in FIG. 9A, the frequency $f_{css}$ of the spread spectrum output signal is also approximately a sinusoidal wave curve that varies with time. Similarly, in the triangle wave modulation mode, as illustrated in FIG. 9B, the frequency $f_{css}$ of the spread spectrum output signal is approximately a triangle wave curve that varies with time; in the sawtooth modulation mode, as illustrated in FIG. 9C, the frequency $f_{css}$ of the spread spectrum output signal is approximately a sawtooth wave curve that varies with time; and in the random modulation mode, as illustrated in FIG. 9D, the frequency $f_{css}$ of the spread spectrum output signal is approximately a random curve that varies with time.

It should be noted that, in FIG. 9A to FIG. 9D, the abscissa represents the time t, and the ordinate represents the frequency $f_{css}$ of the spread spectrum output signal.

Therefore, in the clock spread spectrum method provided by the embodiments of the present disclosure, the control of the frequency of the spread spectrum output signal can be implemented by only controlling the frequency control word F(t). In the case where the frequency control word F(t) is controlled to have waveforms in different modulation modes, the spread spectrum effects of the corresponding modulation modes can be achieved, that is, the frequency sweep within a certain frequency range appearing in the frequency domain. If the frequency difference between the maximum value and minimum value of the frequency control word is larger, the spread spectrum range is wider, that is, the effect of reducing electromagnetic interference is better. In this way, when the spread spectrum function is enabled in the circuit system, the basic functions of the circuit system may not be affected, so that when the circuit system works normally, the spread spectrum function can always be turned on, which can ensure the safety of the circuit system and further reduce the electromagnetic interference of the circuit system.

In addition, in a case where F(t) varies between two integers, the spread spectrum output signal CLK 550 only has two types of periods, one is a long period $T_B$, and the other is a short period $T_A$. Therefore, when designing a digital circuit, it only needs to use a short period to constrain the setup time, and the hold time is not related to the periods but only related to the edge. For the circuit system including the clock spread spectrum circuit, in a case where the spread spectrum function is enabled and not enabled in the circuit system, the periods of the signal output by the TAF-DPS synthesizer 510 only have two period types, which does not affect the normal function of the circuit system, so that the normal operation of the circuit system is ensured, and the electromagnetic interference is further reduced.

For example, the first period is $T_A = I \cdot \Delta_{re}$, and the second period is $T_B = (I+1) \cdot \Delta_{re}$, that is, the two basic periods $T_A$ and $T_B$ used to synthesize the period of the spread spectrum output signal are both related to the integer part I of the target frequency control word. In order to ensure the quality of the spread spectrum output signal that is output, the integer part I of the target frequency control word F(t) remains unchaned during the spread spectrum process, that is, $I = I_r$ (i.e., the integer part of the standard frequency control word). During the spread spectrum process, by allowing the decimal part r(t) of the target frequency control word F(t) to vary with time, the target frequency control word F(t) varies with time. Finally, the frequency $f_{css}$ of the spread spectrum output signal varies within a certain range to achieve the clock spread spectrum. Because of the open loop direct-digital-synthesis principle of the TAF-DPS circuit, no additional clock jitter is introduced during the spread spectrum process. In a case where the integer part I of the target frequency control word F(t) is unchanged, the frequency of the spread spectrum output signal can be guaranteed to vary within a valid range, which can maintain the integrity of data synchronization among the circuit systems.

For example, combining the above formulas (7) and (8), the target frequency control word can be expressed as:

$$F(t) = I + r(t) = I_r + r_r + (I_r + r_r) * \frac{\delta_{re}}{2} * M(t)$$

Among them, $I = I_r$, and $$r(t) = r_r + (I_r + r_r) * \frac{\delta_{re}}{2} * M(t).$$

Because the range of r(t) is [0, 1), that is, $$0 \le r_r + (I_r + r_r) * \frac{\delta_{re}}{2} * M(t) < 1.$$

In a case where I remains unchanged, $I_r \le F(t) < I_r + 1$, so that the maximum value Fmax of the target frequency control word is $I_r + 1$, and the minimum value Fmin of the target frequency control word is $I_r$. In a case where the boundary spread spectrum is used, the first boundary frequency $f_s^u$ and the second boundary frequency $f_s^d$ of the frequency of the spread spectrum output signal correspond to adjacent integer end values, respectively, that is, the adjusting ability of the frequency control word is fully utilized to maximize the spread spectrum depth.

It should be noted that, in the case where the central spread spectrum, the up spread spectrum, or the down spread spectrum is used, in a case where the determined decimal part $r_r$ of the standard frequency control word $F_r$ is close to 0 or 1, the spread spectrum depth is greatly limited.

Figure 10:
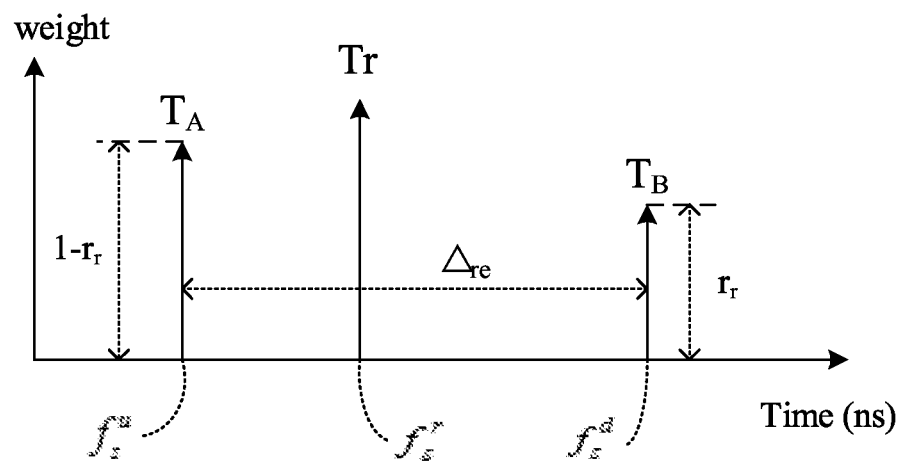
FIG. 10 is a schematic diagram of distribution of a first boundary frequency, a second boundary frequency, and a reference frequency provided by some embodiments of the present disclosure.

FIG. 10 is a schematic diagram of distribution of a first boundary frequency, a second boundary frequency, and a reference frequency provided by some embodiments of the present disclosure.

For example, based on the above formula (11), the reference frequency $f_s^r$ corresponding to the standard frequency control word $F_r$ can be expressed as:

$$f_s^r = \frac{1}{F_r * \Delta_{re}} = \frac{1}{(I_r + r_r) * \Delta_{re}}$$

For example, based on the above formula for the reference frequency $f_s^r$, the reference base time unit $\Delta_{re}$ can be expressed as:

$$\Delta_{re} = \frac{1}{(I_r + r_r) * f_s^r}$$

For example, according to the formula (11), it can be seen that the frequency of the spread spectrum output signal is inversely proportional to the frequency control word, so that the maximum value of the frequency of the spread spectrum output signal is $1/(Fmin * \Delta_{re})$, and the minimum value of the frequency of the spread spectrum output signal is $1/(F_{max}*\Delta_{re})$. Therefore, the spread spectrum depth of the frequency of the spread spectrum output signal can be expressed as: $FD=1/(F_{min}*\Delta_{re})-1/(F_{max}*\Delta_{re})$, where FD represents the spread spectrum depth.

For example, the first boundary frequency $f_s^u$ corresponds to the minimum value Fmin of the target frequency control word, that is, the first boundary frequency $f_s^u$ represents the maximum value of the frequency of the spread spectrum output signal, that is, $1/(F_{min}*\Delta_{re})$. For example, the first boundary frequency $f_s^u$ can be expressed as:

$$f_s^u = \frac{1}{F_{min}*\Delta_{re}} = \frac{1}{I_r*\Delta_{re}} = \frac{I_r+r_r}{I_r}*f_s^r$$

For example, the second boundary frequency $f_s^d$ corresponds to the maximum value Fmax of the target frequency control word, that is, the second boundary frequency $f_s^d$ represents the minimum value of the frequency of the spread spectrum output signal, that is, $1/(F_{max}*\Delta_{re})$. For example, the second boundary frequency $f_s^d$ can be expressed as:

$$f_s^d = \frac{1}{F_{max}*\Delta_{re}} = \frac{1}{(I_r+1)*\Delta_{re}} = \frac{I_r+r_r}{I_r+1}*f_s^r$$

For example, as illustrated in FIG. 10, the reference frequency $f_s^r$ is smaller than the first boundary frequency $f_s^u$ and greater than the second boundary frequency $f_s^d$. Tr illustrated in FIG. 10 represents a period corresponding to the reference frequency $f_s^r$.

For example, as illustrated in FIG. 10, in the case where the frequency of the spread spectrum output signal is the first boundary frequency $f_s^u$, the period of the spread spectrum output signal is composed of the first period $T_A$; in the case where the frequency of the spread spectrum output signal is the second boundary frequency $f_s^d$, the period of the spread spectrum output signal is composed of the second period $T_B$; and in the case where the frequency of the spread spectrum output signal is the reference frequency $f_s^r$, the period of the spread spectrum output signal is composed of the first period $T_A$ and the second period $T_B$, the occurrence probability of the second period $T_B$ is determined by $r_r$, and therefore, $r_r$ can also determine the occurrence probability of the first period $T_A$.

For example, as illustrated in FIG. 10, the difference between the first period $T_A$ and the second period $T_B$ is $\Delta_{re}$.

For example, the value range of the frequency $f_{css}$ of the spread spectrum output signal CLK 550 is $(f_s^d, f_s^u]$, so that $f_{css}$ is expressed as:

$$\frac{I_r+r_r}{I_r+1}*f_s^r < f_{css} \le \frac{I_r+r_r}{I_r}*f_s^r$$

For example, based on the above formula (8) and formula (11), the spread spectrum frequency of the spread spectrum output signal can be expressed as:

$$f(M(t)) = \frac{1}{F(t)*\Delta_{re}} = \frac{1}{F_{re}*\left[1+\frac{\delta_{re}}{2}*M(t)\right]*\Delta_{re}} = \frac{f_{re}}{1+\frac{\delta_{re}}{2}*M(t)}, \quad (12)$$

where $f(M(t))$ represents the spread spectrum frequency, F(t) represents the target frequency control word, $$F(t) = F_{re}*\left[1+\frac{\delta_{re}}{2}*M(t)\right],$$

$F_{re}$ represents the reference frequency control word, $\delta_{re}$ represents the reference spread spectrum depth coefficient, M(t) represents the modulation function, $\Delta_{re}$ represents the reference base time unit, and $f_{re}$ represents a frequency corresponding to the reference frequency control word.

For example, in the case where the modulation function M(t) is the original modulation function, the formula (9) is substituted into the above formula (12), and the spread spectrum frequency of the spread spectrum output signal can be expressed as:

$$f(\xi(t)) = \frac{1}{F_{re}*\left[1+\frac{\delta_{re}}{2}*\xi(t)\right]*\Delta_{re}} = \frac{f_{re}}{1+\frac{\delta_{re}}{2}*\xi(t)} \quad (13)$$

For example, according to the above formula (11), it can be seen that the target frequency control word F(t) is inversely correlated with the spread spectrum frequency of the spread spectrum output signal. Therefore, the spread spectrum frequency of the spread spectrum output signal determined based on the above formula (13) has a non-linear distortion and a range shift. To accurately compensate for the non-linear distortion and range shift caused by the inverse relationship, the original modulation function can be compensated and transformed, and the compensated modulation function can be used for frequency modulation, so that the spread spectrum frequency of the spread spectrum output signal is more accurate.

For example, in some other embodiments, the modulation function M(t) may be a compensation modulation function after compensating for the original modulation function, and the modulation function M(t) can be expressed as:

$$M(t) = E(\xi(t)) = \frac{\xi(t)}{1-\frac{\delta_{re}}{2}*\xi(t)},$$

or $$M(t) = E(\xi(t)) = \frac{-\xi(t)}{1+\frac{\delta_{re}}{2}*\xi(t)},$$

where $E(\xi(t))$ represents the compensation modulation function, and $\xi(t)$ represents the original modulation function.

For example, the compensation modulation function $E(\xi(t))$ is substituted into the above formula (8), and the compensated target frequency control word F(t) can be expressed as:

$$F(t) = I+r(t) = F_{re}*\left[1+\frac{\delta_{re}}{2}*E(\xi(t))\right] =$$

-continued $$F_{re} * \left[1 + \frac{\delta_{re}}{2} * \frac{\xi(t)}{1 - \frac{\delta_{re}}{2} * \xi(t)}\right] = \frac{F_{re}}{1 - \frac{\delta_{re}}{2} * \xi(t)},$$

or $$F(t) = 1 + r(t) = F_{re} * \left[1 + \frac{\delta_{re}}{2} * E(\xi(t))\right] =$$

$$F_{re} * \left[1 + \frac{\delta_{re}}{2} * \frac{-\xi(t)}{1 + \frac{\delta_{re}}{2} * \xi(t)}\right] = \frac{F_{re}}{1 + \frac{\delta_{re}}{2} * \xi(t)}.$$

For example, the compensation modulation function $E(\xi(t))$ is substituted into the above formula (12), and the frequency of the compensated spread spectrum output signal can be expressed as:

$$f(\xi(t)) =$$

$$\frac{f_{re}}{1 + \frac{\delta_{re}}{2} * E(\xi(t))} = \frac{f_{re}}{1 + \frac{\delta_{re}}{2} * \left(\frac{\xi(t)}{1 - \frac{\delta_{re}}{2} * \xi(t)}\right)} = f_{re} * \left(1 - \frac{\delta_{re}}{2} * \xi(t)\right),$$

or $$f(\xi(t)) =$$

$$\frac{f_{re}}{1 + \frac{\delta_{re}}{2} * E(\xi(t))} = \frac{f_{re}}{1 + \frac{\delta_{re}}{2} * \left(\frac{-\xi(t)}{1 + \frac{\delta_{re}}{2} * \xi(t)}\right)} = f_{re} * \left(1 + \frac{\delta_{re}}{2} * \xi(t)\right).$$

Figure 11:
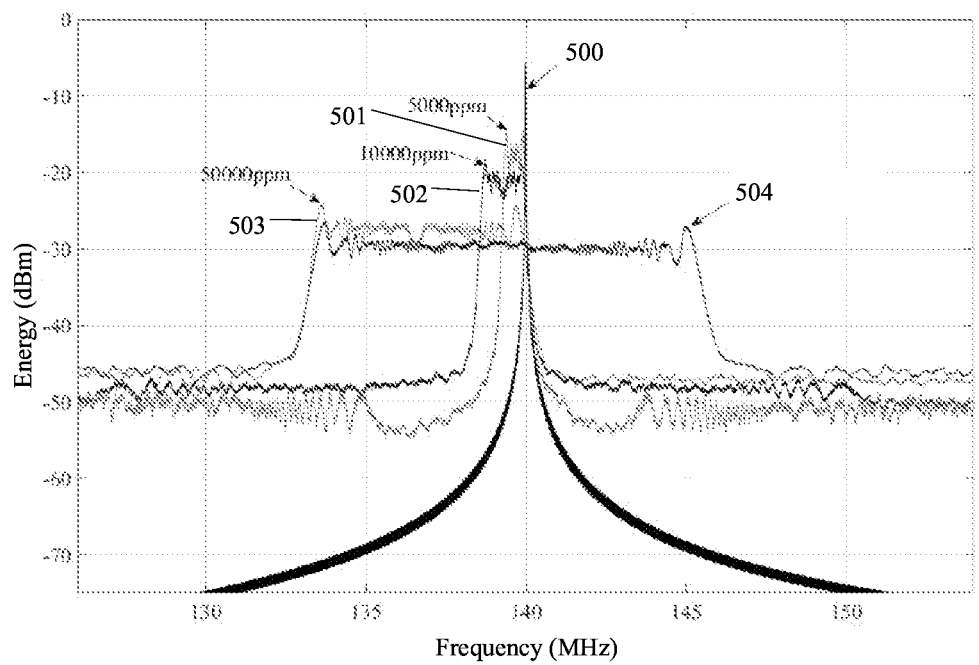
FIG. 11 is a schematic diagram of a spectrum comparison result before and after spread spectrum at different spread spectrum depths provided by some embodiments of the present disclosure.

FIG. 11 is a schematic diagram of a spectrum comparison result before and after spread spectrum at different spread spectrum depths provided by some embodiments of the present disclosure.

For example, in some embodiments, K=16, and the initial base output frequency $f_d$ is 100 MHz, so that the initial base time unit $\Delta_{in}$=(16*100 MHz)=0.625 ns. The initial base time unit is obtained and serves as the reference base time unit $\Delta_{re}$, so that the reference base time unit $\Delta_{re}$ is also 0.625 ns. The output signal with a frequency of 140 MHz is synthesized based on the reference base time unit $\Delta_{re}$, that is, the target frequency $f_T$ is 140 MHz. Each spectrum curve illustrated in FIG. 11 is obtained based on the reference base time unit $\Delta_{re}$=0.625 ns.

For example, as illustrated in FIG. 11, a curve 500 represents a frequency curve without spreading spectrum, for example, a curve of the target frequency. The curve 501 represents the curve of the first spread spectrum frequency when the spread spectrum depth coefficient is 5000 ppm, the curve 502 represents the curve of the second spread spectrum frequency when the spread spectrum depth coefficient is 10,000 ppm, the curve 503 represents the curve of the third spread spectrum frequency when the spread spectrum depth coefficient is 50,000 ppm, and the curve 504 represents the curve of the fourth spread spectrum frequency in the boundary spread spectrum. For example, the first spread spectrum frequency, the second spread spectrum frequency, and the third spread spectrum frequency are all obtained by performing spread spectrum in the down spread spectrum manner, and the first spread spectrum frequency, the second spread spectrum frequency, the third spread spectrum frequency, and the fourth spread spectrum frequency are all obtained by performing spread spectrum in the triangle modulation mode. The modulation rates corresponding to the first spread spectrum frequency, the second spread spectrum frequency, the third spread spectrum frequency, and the fourth spread spectrum frequency are all 30 kHz.

For example, in the boundary spread spectrum, the maximum value of the fourth spread spectrum frequency is 145.455 MHz, and the minimum value of the fourth spread spectrum frequency is 133.333 MHz.

For example, the frequency control word corresponding to the target frequency is: $F_T = I_{ad} + r_{ad} = 1/(f_T * \Delta re) = (140 \text{ MHz} * 0.625 \text{ ns})^{-1} = 11.4285$, that is, $I_{ad}$ is 11, and $r_{ad}$ is 0.4285.

For example, in the case where the spread spectrum manner is the boundary spread spectrum, based on the above formula (2), the spread spectrum depth coefficient is expressed as:

$$\delta_{max} = \frac{1}{I_{ad} + 0.5} = \frac{1}{11.5} \approx 86957 \text{ ppm}$$

For example, as illustrated in FIG. 11, when the spread spectrum depth coefficient is larger, that is, the spread spectrum depth is larger, the energy of the spectrum of the clock signal can be better dispersed. The spread spectrum depth coefficient of the fourth spread spectrum frequency is greater than the spread spectrum depth coefficient of any one of the first spread spectrum frequency, the second spread spectrum frequency, and the third spread spectrum frequency, that is, the spread spectrum depth of the fourth spread spectrum frequency is greater than the spread spectrum depth of any one of the first spread spectrum frequency, the second spread spectrum frequency, and the third spread spectrum frequency. In other words, the boundary spread spectrum can achieve maximum dispersion of energy. It can be seen from the experimental results that, the boundary spread spectrum can maximize the spread spectrum depth while maintaining the quality of the clock signal, thereby effectively suppressing the peak value of the spectrum and reducing the EMI spike noise. The boundary spread spectrum can be applied to all types of spread spectrum modulation curve shapes.

Figure 12:
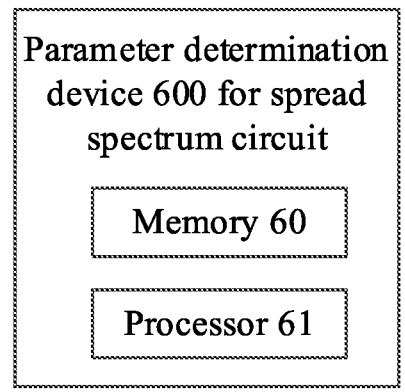
FIG. 12 is a schematic block diagram of a parameter determination device for a spread spectrum circuit provided by some embodiments of the present disclosure.

Some embodiments of the present disclosure further provide a parameter determination device for a spread spectrum circuit. FIG. 12 is a schematic block diagram of a parameter determination device for a spread spectrum circuit provided by some embodiments of the present disclosure.

For example, as illustrated in FIG. 12, the parameter determination device 600 for the spread spectrum circuit provided by some embodiments of the present disclosure may include a memory 60 and a processor 61.

For example, the memory 60 may be configured to store computer readable instructions. For example, the processor 61 may be configured to execute the computer readable instructions, and when the computer readable instructions are executed by the processor 61, the parameter determination method for the spread spectrum circuit according to any one of the above embodiments can be performed.

For example, the processor 61 may be a component having the data processing capability and/or program execution capability, such as a central processing unit (CPU), a tensor processing unit (TPU), etc., and may control other components in the parameter determination device 600 for the spread spectrum circuit to perform the desired function. The central processing unit (CPU) can be an ×86, an ARM architecture, etc.

For example, the memory 60 may include one or more computer program products, and the computer program products may include various forms of computer readable storage media, such as a volatile memory and/or a non-volatile memory. The volatile memory may include, for example, a random access memory (RAM) and/or a cache, etc. The non-volatile memory may include, for example, a read-only memory (ROM), a hard disk, an erasable programmable read-only memory (EPROM), a compact disk read-only memory (CD-ROM), a USB memory, a flash memory, etc. One or more computer readable instructions may be stored in the computer readable storage medium, and the processor 61 may execute the computer readable instructions to implement various functions of the parameter determination device 600 for the spread spectrum circuit.

For example, data can be transmitted between the memory 60 and the processor 61 through a network or a bus system. The memory 60 can be directly or indirectly in communication with the processor 61.

For example, the memory 60 may further store data such as a base spread spectrum depth coefficient, a standard spread spectrum depth coefficient, and a standard frequency control word.

It should be noted that, fore detailed descriptions of the process of using the parameter determination device 60 for the spread spectrum circuit to perform the parameter determination method for the spread spectrum circuit, reference may be made to the related descriptions in the embodiments of the parameter determination method for the spread spectrum circuit, and duplicated details are not described herein again.

Figure 13:
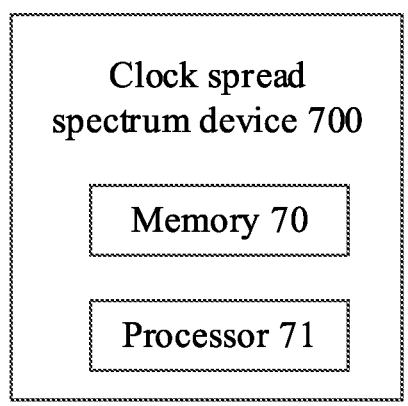
FIG. 13 is a schematic block diagram of a clock spread spectrum device provided by some embodiments of the present disclosure.

Some embodiments of the present disclosure further provide a clock spread spectrum device. FIG. 13 is a schematic block diagram of a clock spread spectrum device provided by some embodiments of the present disclosure.

For example, as illustrated in FIG. 13, the clock spread spectrum device 700 provided by some embodiments of the present disclosure may include a memory 70 and a processor 71.

For example, the memory 70 may be configured to store computer readable instructions. For example, the processor 71 may be configured to execute the computer readable instructions, and when the computer readable instructions are executed by the processor 71, the clock spread spectrum method according to any one of the above embodiments can be performed.

For example, the processor 71 may be a component having the data processing capability and/or program execution capability, such as a central processing unit (CPU), a tensor processing unit (TPU), etc., and may control other components in the clock spread spectrum device 700 to perform the desired function. The central processing unit (CPU) can be an ×86, an ARM architecture, etc.

For example, the memory 70 may include one or more computer program products, and the computer program products may include various forms of computer readable storage media, such as a volatile memory and/or a non-volatile memory. The volatile memory may include, for example, a random access memory (RAM) and/or a cache, etc. The non-volatile memory may include, for example, a read-only memory (ROM), a hard disk, an erasable programmable read-only memory (EPROM), a compact disk read-only memory (CD-ROM), a USB memory, a flash memory, etc. One or more computer readable instructions may be stored in the computer readable storage medium, and the processor 71 may execute the computer readable instructions to implement various functions of the clock spread spectrum device 700.

For example, data can be transmitted between the memory 70 and the processor 71 through a network or a bus system. The memory 70 can be directly or indirectly in communication with the processor 71.

For example, the memory 70 may further store a reference frequency control word $F_{re}$, a modulation rate $V_F$, a reference spread spectrum depth coefficient $\delta_{re}$, etc.

It should be noted that, for detailed descriptions of the process of using the clock spread spectrum device 700 to perform the clock spread spectrum method, reference may be made to the related descriptions in the embodiments of the clock spread spectrum method, and duplicated details are not described herein again.

Some embodiments of the present disclosure further provide a clock spread spectrum device. For example, the clock spread spectrum device may include a parameter determination circuit of a spread spectrum circuit, a control circuit, and a signal generating circuit. For example, the parameter determination circuit for the spread spectrum circuit is used to generate and output parameters such as a standard frequency control word and a standard spread spectrum depth coefficient. The control circuit is configured to obtain a reference frequency control word and a modulation parameter, and determine a target frequency control word according to the reference frequency control word and the modulation parameter, where the target frequency control word varies discretely with time. For example, the reference frequency control word is the standard frequency control word generated by the parameter determination circuit for the spread spectrum circuit, that is, the control circuit is used to obtain the standard frequency control word as the reference frequency control word. The signal generating circuit is configured to generate and output a spread spectrum output signal after spreading spectrum according to the target frequency control word.

It should be noted that the parameter determination circuit for the spread spectrum circuit may include the parameter determination device for the spread spectrum circuit according to any one of the above embodiments. For the related descriptions of the control circuit and the signal generating circuit, reference may be made to the related descriptions of the control circuit 11 and the signal generating circuit 12 in the embodiments of the clock spread spectrum method, respectively, and details are not described herein again.

At least one embodiment of the present disclosure further provides an electronic equipment. For example, the electronic equipment may include the clock spread spectrum device according to any one of the above embodiments.

For example, the electronic equipment may be a liquid crystal display device or the like, and the clock spread spectrum device can be applied to a TCON of the liquid crystal display device. Because the clock spread spectrum device implements the clock spread spectrum based on the TAF-DPS, in a case where the spread spectrum function of the liquid crystal display device is enabled, the display effect of the liquid crystal display device may not be affected.

It should be noted that, for detailed descriptions of the clock spread spectrum device, reference may be made to the related descriptions in the above embodiments of the clock spread spectrum device, and details are not described herein again.

For the present disclosure, the following statements should be noted:

(1) The accompanying drawings involve only the structure(s) in connection with the embodiment(s) of the present disclosure, and other structure(s) can be referred to common design(s).

(2) For the purpose of clarity, in accompanying drawings for illustrating the embodiment(s) of the present disclosure, the thickness of a layer or a region may be enlarged or narrowed, that is, the drawings are not drawn in a real scale. However, it should be understood that, in the case where a component such as a layer, a film, a region, a substrate, or the like is referred to be "on" or "under" another component, the component may be "directly" "on" or "under" the another component, or an intermediate component may be disposed therebetween.

(3) In case of no conflict, the embodiments of the present disclosure and features in one embodiment or in different embodiments can be combined to obtain new embodiments.

What have been described above are only specific implementations of the present disclosure, the protection scope of the present disclosure is not limited thereto, and the protection scope of the present disclosure should be based on the protection scope of the claims.

What is claimed is:

1. A parameter determination method for a spread spectrum circuit, comprising: obtaining a base time unit and a target frequency;
    determining a spread spectrum depth coefficient according to the base time unit and the target frequency;
    determining whether the spread spectrum depth coefficient is greater than or equal to a base spread spectrum depth coefficient;
    adjusting the base time unit until a corresponding spread spectrum depth coefficient corresponding to the base time unit is greater than or equal to the base spread spectrum depth coefficient in a case where the spread spectrum depth coefficient is smaller than the base spread spectrum depth coefficient; and
    determining the spread spectrum depth coefficient as a standard spread spectrum depth coefficient and determining a standard frequency control word according to the standard spread spectrum depth coefficient in a case where the spread spectrum depth coefficient is greater than or equal to the base spread spectrum depth coefficient.

2. The parameter determination method for the spread spectrum circuit according to claim 1, wherein determining the spread spectrum depth coefficient comprises:
    determining a frequency control word according to the base time unit and the target frequency, and
    determining the spread spectrum depth coefficient according to the frequency control word.

3. The parameter determination method for the spread spectrum circuit according to claim 2, wherein determining the spread spectrum depth coefficient according to the frequency control word comprises:
    determining a spread spectrum manner, and
    determining the spread spectrum depth coefficient according to the spread spectrum manner and the frequency control word.

4. The parameter determination method for the spread spectrum circuit according to claim 3, wherein the spread spectrum manner comprises a boundary spread spectrum, a central spread spectrum, an up spread spectrum, or a down spread spectrum;
    in a case where the spread spectrum manner is the boundary spread spectrum, the spread spectrum depth coefficient is expressed as:

$$\delta_{max} = \frac{1}{I_{ad} + 0.5};$$

in a case where the spread spectrum manner is the central spread spectrum, the spread spectrum depth coefficient is expressed as:

$$\delta_{max} < \frac{2*(1-r_{ad})}{I_{ad} + r_{ad}},$$

or $$\delta_{max} \leq \frac{2*r_{ad}}{I_{ad} + r_{ad}};$$

in a case where the spread spectrum manner is the up spread spectrum, the spread spectrum depth coefficient is expressed as:

$$\delta_{max} \leq \frac{r_{ad}}{I_{ad} + r_{ad}};$$

and
    in a case where the spread spectrum manner is the down spread spectrum, the spread spectrum depth coefficient is expressed as:

$$\delta_{max} < \frac{1-r_{ad}}{I_{ad} + r_{ad}},$$

wherein $\delta_{max}$ represents the spread spectrum depth coefficient, $I_{ad}$ is an integer part of the frequency control word, and $r_{ad}$ is a decimal part of the frequency control word.

5. The parameter determination method for the spread spectrum circuit according to claim 4, wherein determining the standard frequency control word according to the standard spread spectrum depth coefficient comprises:
    determining an integer part and a decimal part of the standard frequency control word according to the standard spread spectrum depth coefficient,
    wherein the standard frequency control word is expressed as: $F_r = I_r + r_r$, $F_r$ represents the standard frequency control word, $I_r$ represents the integer part of the standard frequency control word $F_r$, and $r_r$ represents the decimal part of the standard frequency control word $F_r$.

6. The parameter determination method for the spread spectrum circuit according to claim 5, wherein in a case where the spread spectrum depth coefficient is greater than or equal to the base spread spectrum depth coefficient, and the spread spectrum depth coefficient is determined as the standard spread spectrum depth coefficient,
- in a case where the spread spectrum manner is the boundary spread spectrum, the integer part of the standard frequency control word is $I_r=I_{ad}$, and the decimal part of the standard frequency control word is $r_r=0.5$; and
- in a case where the spread spectrum manner is the central spread spectrum, the up spread spectrum, or the down spread spectrum, the integer part of the standard frequency control word is $I_r=I_{ad}$, and the decimal part of the standard frequency control word is $r_r=r_{ad}$.

7. The parameter determination method for the spread spectrum circuit according to claim 5, wherein in a case where the spread spectrum depth coefficient is greater than or equal to the base spread spectrum depth coefficient, the base time unit is determined as a standard base time unit;
the standard frequency control word corresponds to a reference frequency, and the reference frequency is expressed as:

$$f_s^r = f_T * \frac{F_T}{F_r},$$

wherein $f_s^r$ is the reference frequency, $f_T$ is the target frequency, and $F_T$ is the frequency control word; and
the standard frequency control word is expressed as: $F_r=I_r+r_r=1/(f_s^{r}*\Delta_1)$, and $\Delta_1$ represents the standard base time unit.

8. A clock spread spectrum method based on the parameter determination method for the spread spectrum circuit according to claim 1, comprising:
- obtaining a reference frequency control word, wherein the reference frequency control word is the standard frequency control word obtained according to the parameter determination method for the spread spectrum circuit;
- determining a target frequency control word according to the reference frequency control word and a modulation parameter, wherein the target frequency control word varies discretely with time; and
- generating a spread spectrum output signal after spreading spectrum according to the target frequency control word, wherein the spread spectrum output signal corresponds to the target frequency control word.

9. The clock spread spectrum method according to claim 8, wherein the modulation parameter comprises a modulation mode and a reference spread spectrum depth coefficient, and the reference spread spectrum depth coefficient is the standard spread spectrum depth coefficient obtained according to the parameter determination method for the spread spectrum circuit; and
the target frequency control word is expressed as:

$$F(t) = F_{re} * \left[1 + \frac{\delta_{re}}{2} * M(t)\right],$$

wherein F(t) represents the target frequency control word, $F_{re}$ represents the reference frequency control word, $\delta_{re}$ represents the reference spread spectrum depth coefficient, M(t) represents a modulation function determined according to the modulation mode, and t represents time.

10. The clock spread spectrum method according to claim 9, wherein the modulation function is an original modulation function, and the modulation function is expressed as:

$$M(t)=\xi(t),$$

wherein $\xi(t)$ represents the original modulation function; or,
the modulation function is a compensation modulation function after compensating for the original modulation function, and the modulation function is expressed as:

$$M(t) = E(\xi(t)) = \frac{\xi(t)}{1 - \frac{\delta_{re}}{2} * \xi(t)},$$

or $$M(t) = E(\xi(t)) = \frac{-\xi(t)}{1 + \frac{\delta_{re}}{2} * \xi(t)},$$

wherein $E(\xi(t))$ represents the compensation modulation function, and (t) represents the original modulation function.

11. The clock spread spectrum method according to claim 8, wherein the modulation parameter comprises a modulation mode, and
generating the spread spectrum output signal after spreading spectrum according to the target frequency control word comprises:
determining a reference base time unit;
determining a modulation function according to the modulation mode; and
determining the spread spectrum output signal based on the modulation function, the reference base time unit, and the target frequency control word,
wherein a spread spectrum frequency of the spread spectrum output signal is expressed as:

$$f(M(t)) = \frac{1}{F(t)*\Delta_{re}} = \frac{1}{F_{re}*\left[1 + \frac{\delta_{re}}{2} * M(t)\right]*\Delta_{re}} = \frac{f_{re}}{1 + \frac{\delta_{re}}{2} * M(t)},$$

wherein f(M(t)) represents the spread spectrum frequency, F(t) represents the target frequency control word, $$F(t) = F_{re} * \left[1 + \frac{\delta_{re}}{2} * M(t)\right],$$

$F_{re}$ represents the reference frequency control word, $\delta_{re}$ represents the reference spread spectrum depth coefficient, M(t) represents the modulation function, $\Delta_{re}$ represents the reference base time unit, and $f_{re}$ represents a frequency corresponding to the reference frequency control word.

12. The clock spread spectrum method according to claim 11, wherein the modulation function is an original modulation function, and the modulation function is expressed as:

$$M(t)=\xi(t),$$

wherein $\xi(t)$ represents the original modulation function; or, the modulation function is a compensation modulation function after compensating for the original modulation function, and the modulation function is expressed as:

$$M(t) = E(\xi(t)) = \frac{\xi(t)}{1 - \frac{\delta_{re}}{2} * \xi(t)},$$

or $$M(t) = E(\xi(t)) = \frac{-\xi(t)}{1 + \frac{\delta_{re}}{2} * \xi(t)},$$

wherein $E(\xi(t))$ represents the compensation modulation function, and (t) represents the original modulation function.

13. The clock spread spectrum method according to claim 9, wherein the modulation mode comprises a triangle modulation mode, a sawtooth modulation mode, a sinusoidal modulation mode, or a random modulation mode.

14. The clock spread spectrum method according to claim 8, wherein a maximum value Fmax of the target frequency control word and a minimum value Fmin of the target frequency control word satisfy a following formula:

0≤Fmax−Fmin<1.

15. A parameter determination device for a spread spectrum circuit, comprising:
a memory, configured to store computer readable instructions; and
a processor, configured to execute the computer readable instructions,
wherein when the computer readable instructions are executed by the processor, the processor performs:
obtaining a base time unit and a target frequency;
determining a spread spectrum depth coefficient according to the base time unit and the target frequency;
determining whether the spread spectrum depth coefficient is greater than or equal to a base spread spectrum depth coefficient;
adjusting the base time unit until a corresponding spread spectrum depth coefficient corresponding to the base time unit is greater than or equal to the base spread spectrum depth coefficient in a case where the spread spectrum depth coefficient is smaller than the base spread spectrum depth coefficient; and
determining the spread spectrum depth coefficient as a standard spread spectrum depth coefficient and determining a standard frequency control word according to the standard spread spectrum depth coefficient in a case where the spread spectrum depth coefficient is greater than or equal to the base spread spectrum depth coefficient.

16. A clock spread spectrum device, comprising:
a memory, configured to store computer readable instructions; and
a processor, configured to execute the computer readable instructions and perform the clock spread spectrum method according to claim 8 when the computer readable instructions are executed by the processor.

17. The parameter determination method for the spread spectrum circuit according to claim 6, wherein in a case where the spread spectrum depth coefficient is greater than or equal to the base spread spectrum depth coefficient, the base time unit is determined as a standard base time unit;
the standard frequency control word corresponds to a reference frequency, and the reference frequency is expressed as:

$$f_s^r = f_T * \frac{F_T}{F_r},$$

wherein $f_s^r$ is the reference frequency, $f_T$ is the target frequency, and $F_T$ is the frequency control word; and
the standard frequency control word is expressed as:
$F_r = I_r + r_r = 1/(f_s^r * \Delta_1)$, and $\Delta_1$ represents the standard base time unit.

18. A clock spread spectrum method based on the parameter determination method for the spread spectrum circuit according to claim 2, comprising:
obtaining a reference frequency control word, wherein the reference frequency control word is the standard frequency control word obtained according to the parameter determination method for the spread spectrum circuit;
determining a target frequency control word according to the reference frequency control word and a modulation parameter, wherein the target frequency control word varies discretely with time; and
generating a spread spectrum output signal after spreading spectrum according to the target frequency control word, wherein the spread spectrum output signal corresponds to the target frequency control word.

19. The clock spread spectrum method according to claim 18, wherein the modulation parameter comprises a modulation mode and a reference spread spectrum depth coefficient, and the reference spread spectrum depth coefficient is the standard spread spectrum depth coefficient obtained according to the parameter determination method for the spread spectrum circuit; and
the target frequency control word is expressed as:

$$F(t) = F_{re} * \left[1 + \frac{\delta_{re}}{2} * M(t)\right],$$

wherein F(t) represents the target frequency control word, $F_{re}$ represents the reference frequency control word, $\delta_{re}$ represents the reference spread spectrum depth coefficient, M(t) represents a modulation function determined according to the modulation mode, and t represents time.

20. The clock spread spectrum method according to claim 19, wherein the modulation function is an original modulation function, and the modulation function is expressed as:

M(t)=ξ(t), wherein ξ(t) represents the original modulation function; or,
the modulation function is a compensation modulation function after compensating for the original modulation function, and the modulation function is expressed as:

$$M(t) = E(\xi(t)) = \frac{\xi(t)}{1 - \frac{\delta_{re}}{2} * \xi(t)},$$

or $$M(t) = E(\xi(t)) = \frac{-\xi(t)}{1 + \frac{\delta_{re}}{2} * \xi(t)},$$

wherein $E(\xi(t))$ represents the compensation modulation function, and $\xi(t)$ represents the original modulation function.

\* \* \* \* \*